(12) United States Patent
Yamane et al.

(10) Patent No.: US 7,307,298 B2
(45) Date of Patent: Dec. 11, 2007

(54) SEMICONDUCTOR DEVICE

(75) Inventors: Masao Yamane, Takasaki (JP); Atsushi Kurokawa, Takasaki (JP); Shinya Osakabe, Takasaki (JP); Eigo Tange, Takasaki (JP); Yasushi Shigeno, Maebashi (JP); Hiroyuki Takazawa, Hino (JP)

(73) Assignee: Renesas Technology Corp., Tokyo (JP)

( * ) Notice: Subject to any disclaimer, the term of this patent is extended or adjusted under 35 U.S.C. 154(b) by 282 days.

(21) Appl. No.: 10/989,388

(22) Filed: Nov. 17, 2004

(65) Prior Publication Data

US 2005/0116253 A1 Jun. 2, 2005

(30) Foreign Application Priority Data

Nov. 27, 2003 (JP) ............................. 2003-397982

(51) Int. Cl.
*H01L 29/80* (2006.01)
*H01L 31/12* (2006.01)
(52) U.S. Cl. ..................................... 257/280
(58) Field of Classification Search ................ 257/280
See application file for complete search history.

(56) References Cited

U.S. PATENT DOCUMENTS 6,222,210 B1 * 4/2001 Cerny et al. ................ 257/194

FOREIGN PATENT DOCUMENTS

| JP | 2000-332030 | 11/2000 |
| JP | 2001-284367 | 10/2001 |

* cited by examiner

*Primary Examiner*—Fernando L. Toledo
(74) *Attorney, Agent, or Firm*—Mattingly, Stanger, Malur & Brundidge, P.C.

(57) ABSTRACT

The present invention miniaturizes a HEMT element used as a switching element in a radio frequency module. A single gate electrode 17 is formed in an active region defined by an element separation portion 9 on a main surface of a substrate 1 comprising GaAs. The gate electrode 17 is patterned so as to extend in the vertical direction of the page surface between source electrodes 13 and drain electrodes 14, and to extend in left and right directions at other portions. Thus, the ratio of the gate electrode 17 disposed outside the active region is reduced, and the area of a gate pad 17A is reduced.

21 Claims, 41 Drawing Sheets

FIG. 34

| SIMULATION NO. | 1 | 2 | 3 | 4 | 5 | PATTERN NO. | | | | |
|---|---|---|---|---|---|---|---|---|---|---|
| | | | | | | 1 | 2 | 3 | 4 | 5 |
| | 1 | 2 | 3 | 4 | 5 | 6 | 7 | 8 | 9 | 10 |
| Wf | 50 | 50 | 50 | 50 | 50 | 150 | 150 | 150 | 150 | 150 |
| n | 60 | 60 | 60 | 60 | 60 | 20 | 20 | 20 | 20 | 20 |
| S/Ron | 135000 | 126000 | 144000 | 172193 | 172193 | 92143 | 89510 | 94776 | 99997 | 99997 |
| S/Ctotal | 147837 | 132870 | 151852 | 136477 | 136477 | 123766 | 118669 | 125649 | 120749 | 120749 |
| S/Ron×10⁻⁵ | 1.35 | 1.26 | 1.44 | 1.72 | 1.72 | 0.92 | 0.90 | 0.95 | 1.00 | 1.00 |
| Ron/Ctotal | 1.10 | 1.05 | 1.05 | 0.79 | 0.79 | 1.34 | 1.33 | 1.33 | 1.21 | 1.21 |
| S/Ctotal×10⁻⁵ | 1.48 | 1.33 | 1.52 | 1.36 | 1.36 | 1.24 | 1.19 | 1.26 | 1.21 | 1.21 |

SEMICONDUCTOR DEVICE

BACKGROUND OF THE INVENTION

1. Field of the Invention

The present invention relates to a semiconductor device, and in particular to technology that is effective for application to a semiconductor device including a high electron mobility transistor (HEMT) element.

2. Description of the Related Art

There is technology where a first source electrode and a second source electrode are alternately disposed, and where a wide portion of the first source electrode, in which via holes are formed periodically, and a wide portion of the second source electrode, in which via holes are formed periodically, are disposed so as to be staggered, whereby the source electrode arrangement pitch is shortened and the dimension in the chip longitudinal direction is shortened (e.g., see JP-A-2000-332030).

There is also technology where, in a radio frequency-use field effect transistor where a comb-tooth-shaped drain electrode and a comb-tooth-shaped source electrode are mutually meshed together, a leading end portion of a drain finger extending as far as an inactive region in comparison to a drain ohmic electrode that is in an active region is retracted, and similarly a leading end portion of a source finger extending as far as the inactive region in comparison to a source ohmic electrode that is in an active region is retracted, whereby the parasitic capacitance between the drain and the source is reduced (e.g., see JP-A-2001-284367).

A HEMT is a high-speed field effect transistor where a two-dimensional electron gas layer formed by a compound semiconductor heterojunction is used as a current channel. In a HEMT, high mobility electrons are connected by source/drain ohmic electrodes, and a field effect transistor (FET) is caused to operate by controlling the current with a gate electrode. Also, because the frequency band of radio waves used in information systems such as mobile communication, wireless local area networks (LAN) and collision prevention radars ranges from the microwave range to the milliwave range, which is high, a HEMT including high electron mobility is suitable for use in circuits included in those information systems.

The present inventors studied technology where a HEMT was applied, as a switching element, to an antenna switch circuit, which is one radio frequency circuit included in a radio frequency (RF) module disposed in a mobile communication device such as a mobile telephone. In the process of their studies, the present inventors discovered the following problem. This problem will be described using FIGS. 44 to 50.

FIG. 44 is a plan diagram showing an example of a structure of a HEMT element for radio frequency amplification that the present inventors studied. FIG. 45 is a cross-sectional diagram along line A-A of FIG. 44. FIG. 46 is a plan diagram showing another example of a structure of a HEMT element that the present inventors studied. FIG. 47 is a cross-sectional diagram along line A-A of FIG. 46.

In the HEMT elements that the present inventors studied, a gate electrode 104 is disposed, so as to extend in a [−1-10] direction called an inverted mesa direction, between a source electrode 102 and drain electrode 103 on a semiconductor substrate 101 having GaAs (gallium arsenic) as a main component and including a (001) surface as a main surface. FIG. 44 shows a plan structure where the gate electrode 104 includes one finger that extends in the inverted mesa direction, and FIG. 46 shows a plan structure where the gate electrode 104 includes two fingers that extend in the inverted mesa direction. Also, as shown in FIG. 48, the source electrode 102, the drain electrode 103 and the gate electrode 104 of the structures shown in FIGS. 44 and 46 are plurally organized by a source wiring 105, a drain wiring 106 and a gate wiring 107 to form a single block, and plural blocks are organized in parallel to form the final HEMT element. FIG. 48 is a plan diagram of a structure where two of the structures shown in FIG. 46 are connected in parallel. FIG. 49 is a cross-sectional diagram along line A-A of FIG. 48. The reason why the gate electrodes 104 are made to extend in the inverted mesa direction is that the GaAs crystal forming the semiconductor substrate 101 does not have an inverted symmetry, so that, for example, the polarities of the charges generated by a piezoelectric field with respect to stress become opposite between the [−1-10] direction and the [1-10] direction, which directions are 90° different. Namely, the directions are 90° different between the [−1-10] direction and the [1-10] direction on the main surface of the semiconductor substrate 101, and as shown in FIG. 50, the threshold voltage and the temperature dependency of the current, which are the basics of the electrical characteristics of a HEMT, differ between the case where the gate electrode 104 extends along the [−1-10] direction and the case where the gate electrode 104 extends along the [1-10] direction. For example, with respect to the threshold voltage, changes occur in comparison to a state where stress is not working, and the directions of the changes are opposite and the amounts of the changes are the same between the [−1-10] direction and the [1-10] direction.

Also, when the gate electrodes 104 are patterned, in order to form plural gate electrodes 104 with the same dimension, the plural gate electrodes 104 are patterned so as extend in the same direction because it is easy for dimensional differences resulting from photolithography to arise due to the direction. Also, with a HEMT element for radio frequency amplification, because it is necessary for the input resistances of the gate electrodes to be low in order to obtain high gain, a technique is adopted where a number of gate electrodes 104 with which the necessary total gate width can be obtained are disposed using, as a reference, one gate electrode 104 including an optimized gate length.

The demand for miniaturization has been increasing with respect to HEMT elements used as switching elements in radio frequency modules. In the above-described HEMT formed using GaAs epitaxial crystal as a base, end portions of the conductive layer (semiconductor substrate 101) of one gate electrode 104 in the gate width direction are removed by mesa etching, so that electrical isolation is achieved. A gate pad 104A (see FIGS. 44, 46 and 48) for connection to contact holes from the upper layer gate wiring 107 is disposed for all the finger portions of the gate electrodes 104. For this reason, the problem that the miniaturization of the HEMT element is inhibited remains because a region for achieving the isolation and a region for disposing the gate pad 104A must be secured.

SUMMARY OF THE INVENTION

It is an object of the present invention to provide technology that can miniaturize a HEMT element used as a switching element in a radio frequency module.

This and other objects and novel features of the present invention will become apparent from the description of the specification and from the attached drawings.

The gist of the representative invention of the inventions disclosed in the present specification can be briefly described as follows.

Namely, a semiconductor device according to the present invention includes a first channel type HEMT, the HEMT including: a channel layer formed in an active region surrounded by an isolation region on a main surface of a substrate; an electron supplying layer formed on the channel layer; a gate electrode Schottky-connected to the electron supplying layer; and a source electrode and a drain electrode ohmic-connected to the electron supplying layer, wherein the gate electrode extends along a first direction and a second direction that intersects the first direction in plan view.

The effect obtained by the representative invention of the inventions disclosed in the present specification can be briefly described as follows.

Namely, a HEMT element can be miniaturized.

BRIEF DESCRIPTION OF THE DRAWINGS

FIG. 34 is a table showing the respective characteristics of the HEMTs that the semiconductor device of the first embodiment of the invention includes and the HEMTs that the present inventors studied;

FIG. 40 is an equivalent circuit diagram when the HEMT that the semiconductor device of the first embodiment of the invention includes is ON;

DESCRIPTION OF THE PREFERRED EMBODIMENTS

Figure 1:
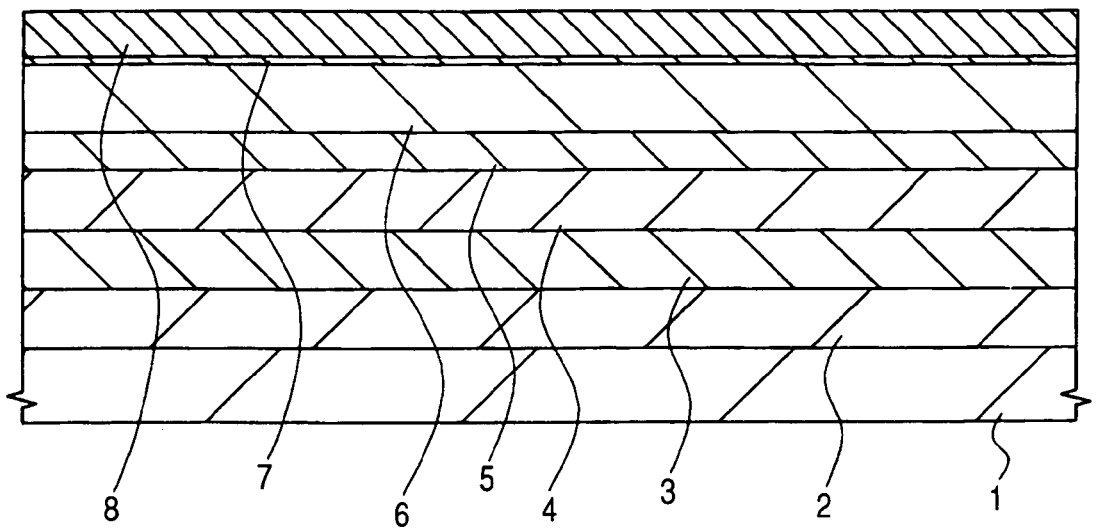
FIG. 1 is a cross-sectional diagram for describing a method of fabricating a semiconductor device of a first embodiment of the invention.

Embodiments of the invention will be described in detail below on the basis of the drawings. In all of the drawings describing the embodiments, the same reference numerals will in principle be given to the same members, and repetitive description of those members will be omitted.

First Embodiment

A semiconductor device of a first embodiment includes an n-channel type (first channel type) HEMT serving as a switching element in an antenna switch circuit that is one radio frequency circuit included in a radio frequency module disposed in a mobile communication device such as a mobile telephone. The semiconductor device of the first embodiment will be described in accordance with a process of fabricating the semiconductor device.

Figure 2:
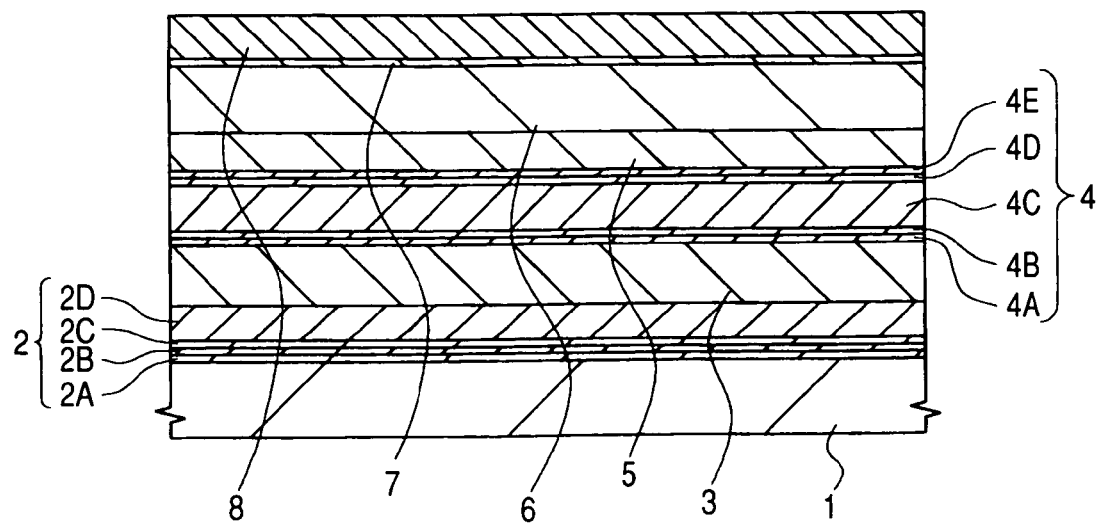
FIG. 2 is a cross-sectional diagram showing in further detail the cross section of a substrate shown in FIG. 1.

First, as shown in FIG. 1, a semiconductor substrate 1 (referred to below simply as "the substrate 1") comprising GaAs, which is a compound semiconductor, is prepared. Next, a buffer layer 2, an electron supplying layer 3, a channel layer 4, an electron supplying layer 5, a Schottky layer (electron supplying layer) 6, an interlayer film 7 and a cap layer 8 are sequentially epitaxially grown on a main surface (element formation surface) of the substrate 1 by metal organic chemical vapor deposition (MOCVD). As shown in FIG. 2, the buffer layer 2 is formed by sequentially laminating, from the bottom layer, an undoped GaAs layer 2A of a film thickness of about 1000 Å, an undoped AlGaAs (aluminium gallium arsenic) layer 2B of a film thickness of about 100 Å, an undoped GaAs layer 2C of a film thickness of about 500 Å and an undoped AlGaAs layer 2D of a film thickness of about 3000 Å. The electron supplying layer 3 is formed from an n$^+$ type AlGaAs layer of a film thickness of about 100 Å, and impure ions (e.g., silicon ions) of an n-type conductive type (first conductive type) are introduced at a concentration of about $5\times10^{17}$ cm$^{-3}$. The channel layer 4 is formed by sequentially laminating, from the bottom layer, an undoped AlGaAs layer 4A of a film thickness of about 20 Å, an undoped GaAs layer 4B of a film thickness of about 20 Å, an undoped InGaAs layer 4C of a film thickness of about 112 Å, an undoped GaAs layer 4D of a film thickness of about 20 Å and an undoped AlGaAs layer 4E of a film thickness of about 20 Å. The electron supplying layer 5 is formed from an n$^+$ type AlGaAs layer of a film thickness of about 100 Å, and impure ions (e.g., silicon ions) of an n-type conductive type are introduced at a concentration of about $3.1\times10^{18}$ cm$^{-3}$. The Schottky layer 6 is formed from an n$^+$ type AlGaAs layer of a film thickness of about 590 Å, and impure ions (e.g., silicon ions) of an n-type conductive type are introduced at a concentration of about $2\times10^{16}$ cm$^{-3}$. The interlayer film 7 is formed from an n$^+$ type AlGaAs layer of a film thickness of about 30 Å, and impure ions (e.g., silicon ions) of an n-type conductive type are introduced at a concentration of about $5\times10^{18}$ cm$^{-3}$. The cap layer 8 is formed from an n$^+$ type GaAs layer of a film thickness of about 1400 Å, and impure ions (e.g., silicon ions) of an n-type conductive type are introduced at a concentration of about $5\times10^{18}$ cm$^{-3}$.

Figure 3:
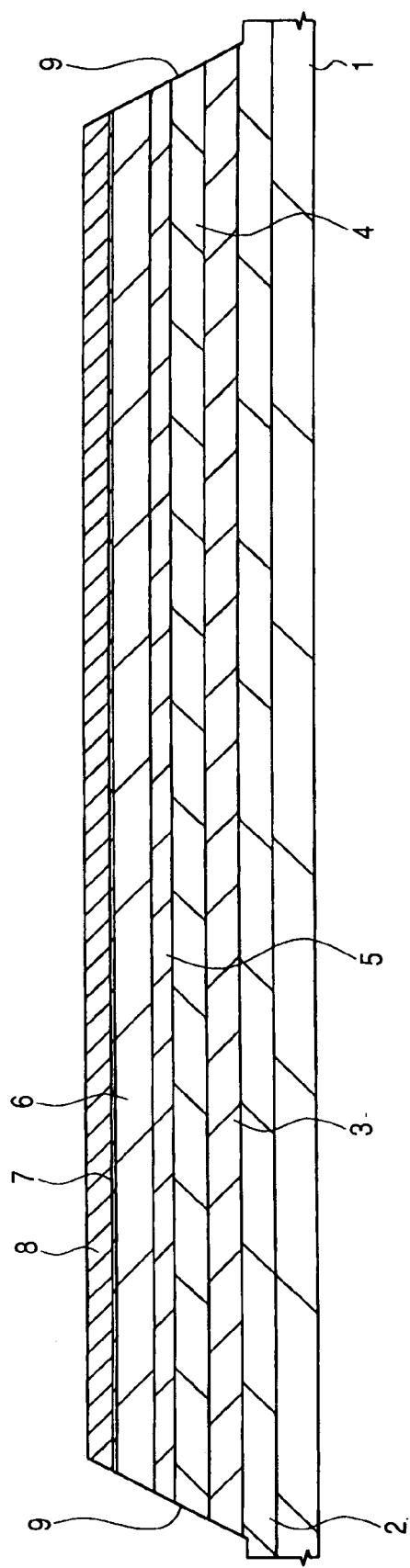
FIG. 3 is a cross-sectional diagram showing the semiconductor device during the fabrication process continued from FIG. 1.

Next, as shown in FIG. 3, semiconductor chip (referred to below simply as a chip) region peripheral portions of the cap layer 8, the interlayer film 7, the Schottky layer 6, the electron supplying layer 5, the channel layer 4 and the electron supplying layer 3 are removed by mesa etching to form an element separation portion (isolation region) 9. By forming the element separation portion 9, an active region (element formation region) can be defined.

Figure 4:
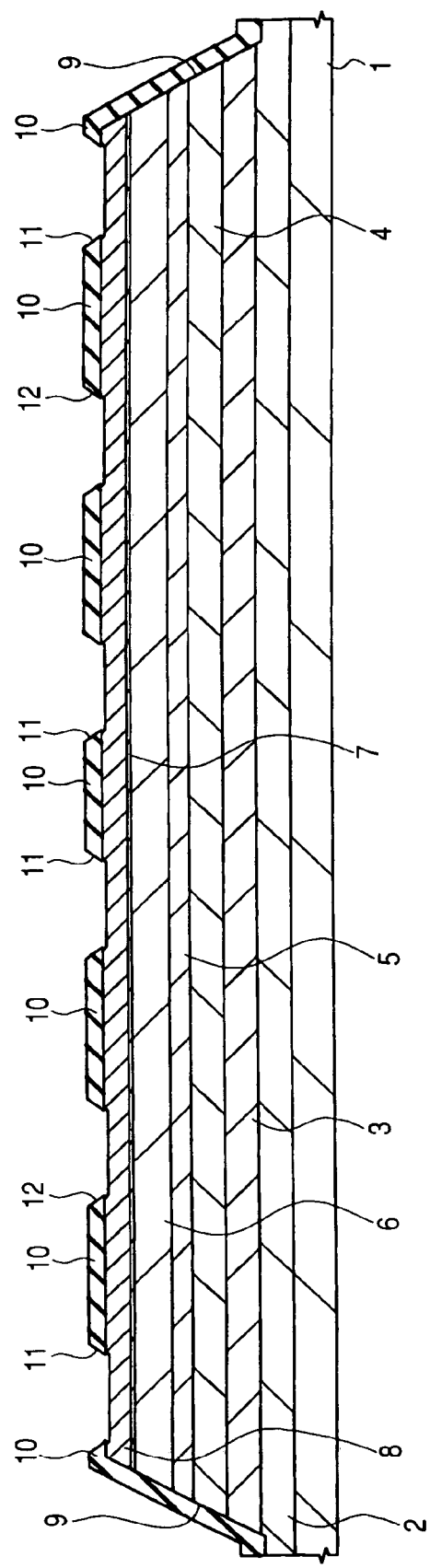
FIG. 4 is a cross-sectional diagram showing the semiconductor device during the fabrication process continued from FIG. 3.
Figure 5:
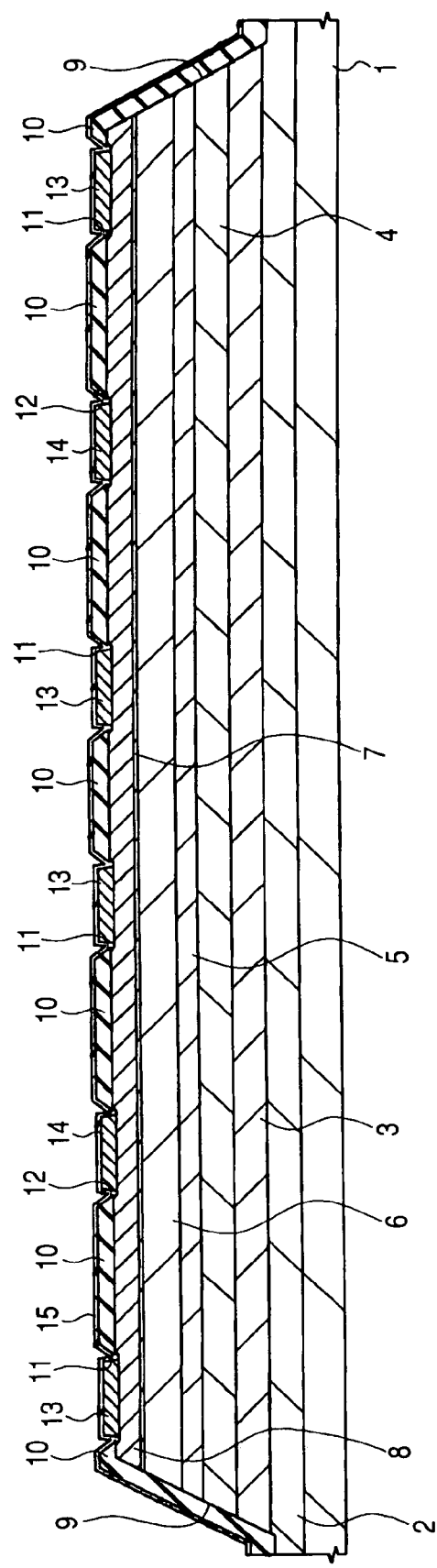
FIG. 5 is a cross-sectional diagram showing the semiconductor device during the fabrication process continued from FIG. 4.

Next, as shown in FIG. 4, a silicon oxide film 10 is deposited an the substrate 1 by, for example, chemical vapor deposition (CVD). Next, the silicon oxide film 10 is etched using, as a mask, a photoresist film (not shown) that has been patterned by photolithography, so that open portions 11 and 12, which reach the cap layer 8, are formed in the silicon oxide film 10. Next, as shown in FIG. 5, an AuGe (gold germanium) film and a Ni (nickel) film are sequentially vapor-deposited in the open portions 11 and 12 using the photoresist film as a mask, whereby source electrodes 13 and drain electrodes 14 that respectly ohmic-contact the cap layer 8 are formed inside the open portions 11 and 12. After the source electrodes 13 and the drain electrodes 14 have been formed, the photoresist film 13 is removed. Next, a protective film 15 is formed by depositing a silicon oxide film on the substrate 1 by CVD.

Figure 6:
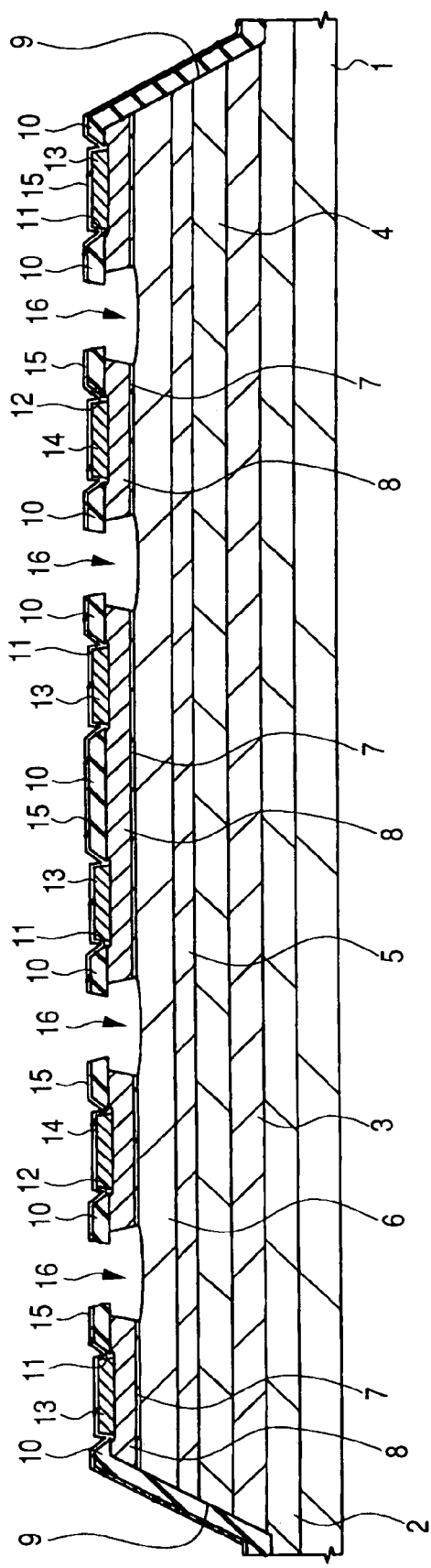
FIG. 6 is a cross-sectional diagram showing the semiconductor device during the fabrication process continued from FIG. 5.
Figure 7:
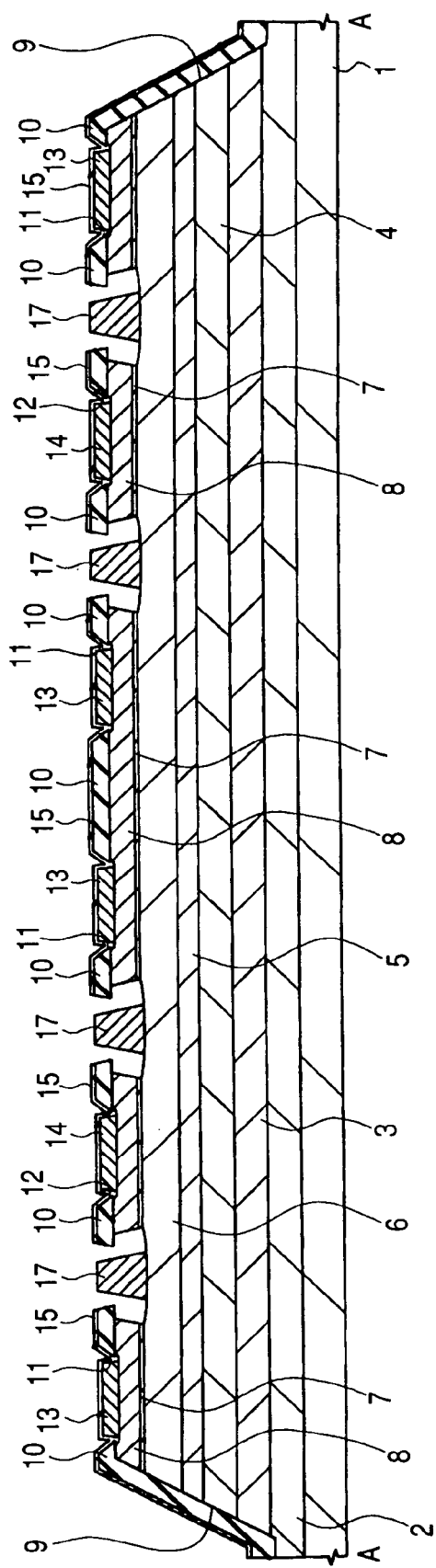
FIG. 7 is a cross-sectional diagram showing the semiconductor device during the fabrication process continued from FIG. 6.

Next, as shown in FIG. 6, the protective film 15, the silicon oxide film 10, the cap layer 8 and the interlayer film 7 are etched using, as a mask, a photoresist film (not shown) that has been patterned by photolithography, so that open portions 16 are formed. Next, as shown in FIG. 7, Pt (platinum) is vapor-deposited inside the open portions 16 (see FIG. 6) using the photoresist film as a mask, so that a gate electrode (first gate portion) 17 that ohmic-contacts the Schottky layer 6 is formed inside the open portions 16. In the first embodiment, the gate electrode 17 is formed so that the gate length is 1 μm or less, preferably about 0.65 μm to 0.8 μm, and more preferably about 0.3 μm. After the gate electrode 17 has been formed, the photoresist film is removed.

Figure 8:
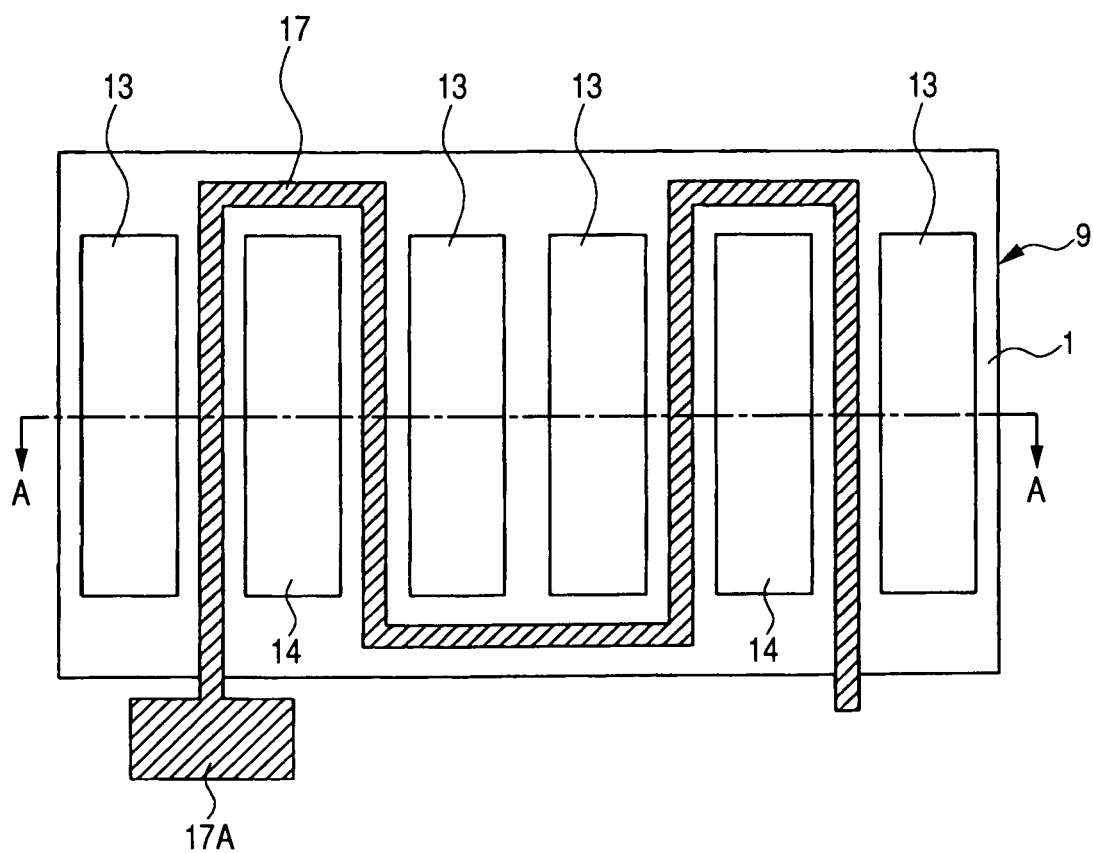
FIG. 8 is a plan diagram of the semiconductor device of a first embodiment of the invention during the fabrication process.

Here, FIG. 8 shows a plan view of the chip region after the gate electrode 17 has been formed, and the cross section shown in FIG. 7 corresponds to the cross section along line A-A of FIG. 8. In FIG. 8, the gate electrode 17 is represented with hatching. As shown in FIG. 8, in the first embodiment, the gate electrode 17 is patterned so that it enters the chip region surrounded by the element separation portion 9 excluding agate pad (second gate portion) 17A for connection with a contact hole from upper layer wiring. Also, the gate electrode 17 is patterned so that it becomes one continuous electrode in the chip region and extends in the vertical direction (with respect to the surface of the page of FIG. 8) between the gate electrodes 13 and the drain electrodes 14 and extends in the left and right directions at the other portions.

With respect to the GaAs forming the substrate 1, the crystal does not have an inverted symmetry. For example, when the main surface of the substrate 1 is a (001) surface, the polarities of the charges generated by a piezoelectric field with respect to stress become opposite between the [−1-10] direction and the [1-10] direction, which are 90° different each other. Namely, the directions are 90° different between the [−1-10] direction and the [1-10] direction on the main surface of the substrate 1, and the threshold voltage and the temperature dependency of the current, which are the basics of the electrical characteristics of a HEAT, differ between the case where the gate electrode 17 extends along the [−1-10] direction and the case where the gate electrode 17 extends along the [1-10] direction. For example, with respect to the threshold voltage, changes occur in comparison to a state where stress is not working, and the directions of the changes are opposite and the amounts of the changes become the same between the [−1-10] direction and the [1-10] direction.

Figure 9:
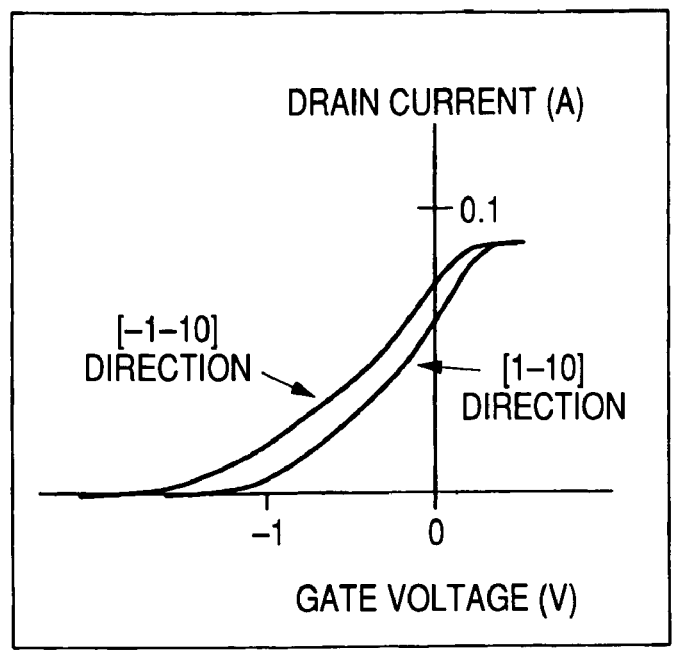
FIG. 9 is an explanatory diagram showing drain current characteristics of a HEMT that the semiconductor device of the first embodiment of the invention has.
Figure 10:
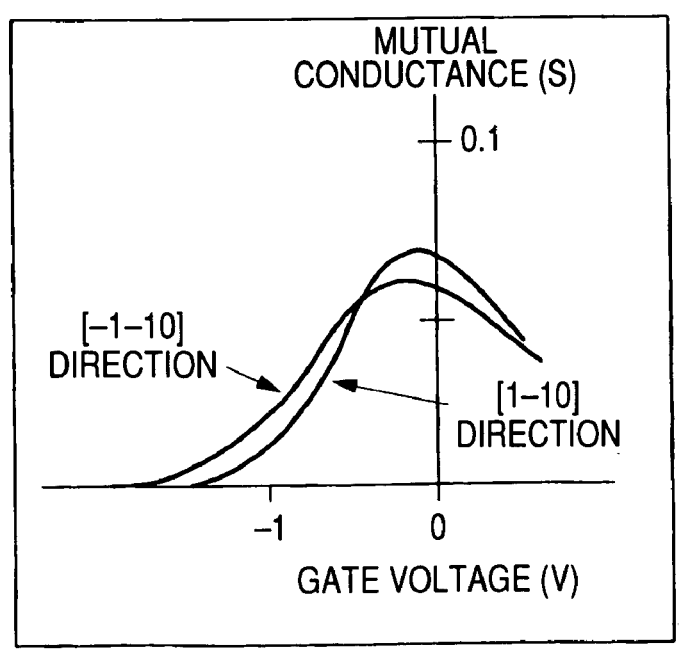
FIG. 10 is an explanatory diagram showing mutual conductance characteristics of the HEMT that the semiconductor device of the first embodiment of the invention has.
Figure 11:
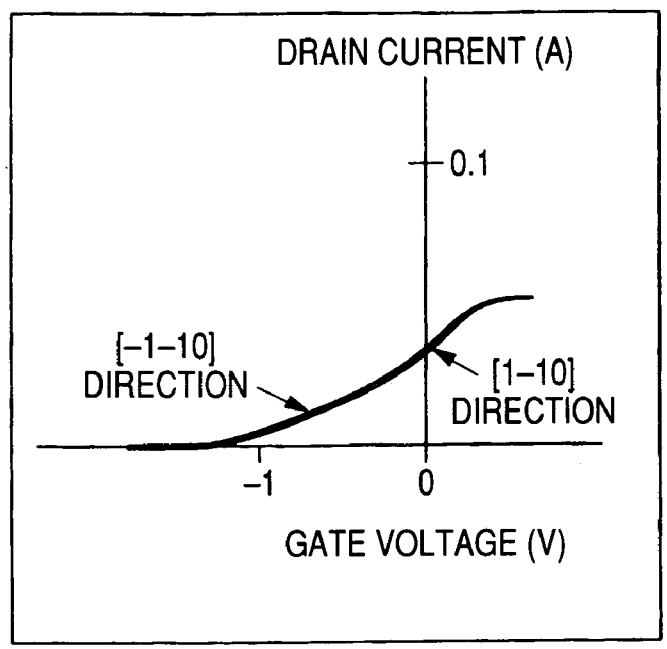
FIG. 11 is an explanatory diagram showing drain current characteristics of the HEMT that the semiconductor device of the first embodiment of the invention has.
Figure 12:
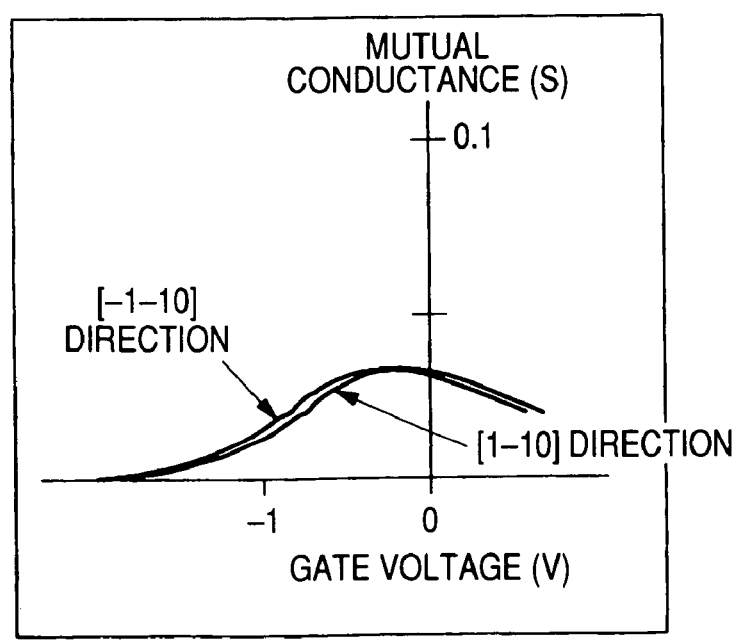
FIG. 12 is an explanatory diagram showing mutual conductance characteristics of the HEMT that the semiconductor device of the first embodiment of the invention has.

Also, the stress applied to the gate electrode 17 is inversely proportional to the gate length. For this reason, the smaller the gate length is the larger the stress becomes so that, a charge is generated by a piezoelectric field proportional to the stress. Here, FIGS. 9 and 10 respectively show the drain current characteristics and the mutual conductance characteristics of the HEMT when the gate length is 0.3 μm and the gate width is 0.1 mm. FIGS. 11 and 12 respectively show the drain current characteristics and the mutual conductance characteristics of the HEMT when the gate length is 1.5 μm and the gate width is 0.1 mm. FIGS. 9 to 12 show characteristics in regard to a case where the gate electrode 17 extends in the [−1-10] direction and a case where the gate electrode 17 extends in the [1-10] direction. It should be noted that FIGS. 9 to 12 show the results of investigation through experiments by the present inventors. As shown in FIGS. 9 and 11, the change in the threshold voltage was greater in the case where the gate Length was 0.3 μm than in the case where the gate length was 1.5 μm. In the case where the gate length was 0.3 μm, the threshold voltage when stress was not working was about 1.4 V but changed by about 0.2 V; in the case where the gate electrode 17 extended in the [1-10] direction, it was about −1.2 V, and in the case where the gate electrode 17 extended in the [−1-10] direction, it was about −1.6 V. Also, as shown in FIGS. 10 and 12, the change in the mutual conductance became greater as the change in the threshold voltage became greater. For this reason, it is difficult to connect, in parallel, HEMTs where the extension directions of the gate electrodes are different, and to use it, for example, as a signal amplifying element. On the other hand, there is no difference in the saturation values of the drain currents even if the extension directions of the gate electrodes are different (see FIG. 9). Also, even if the extension directions of the gate electrodes are different, the difference in the drain current values becomes smaller as the drain current approaches a pinch off state or a saturation state, and the difference disappears at a predetermined gate voltage value. For example, when the gate voltage is 2 V, the drain current reaches the pinch off state regardless of the extension directions of the gate electrode, and when the gate voltage is 0.6 V, the drain current reaches the saturation state regardless of the extension directions of the gate electrode. As mentioned previously, the HEMT of the first embodiment is used as a switching element, and as long as it is used as a switching element, it is used in a state where the drain current is in either the saturation state or the pinch off state. Namely, with the HEMT of the first embodiment, the extension directions of the gate electrode 17 may be mixed, and it becomes possible to form a single gate electrode 17 where the extension directions are mixed as shown in FIG. 8.

In accompaniment with the aforementioned demand to miniaturize radio frequency modules, there has been the demand to miniaturize chips where a HEMT is formed. Here, assuming a case where one gate electrode is disposed between each of the source electrodes 13 and the drain electrodes 14 so that all the gate electrodes are electrically connected by one gate pad, there is the possibility that the gate pad become large in order to connect with all the gate electrodes, so that the miniaturization of the chip is inhibited. On the other hand, as mentioned previously using FIG. 8, the HEMT of the first embodiment has a structure where the each gate electrode 17 disposed between the source electrodes 13 and the drain electrodes 14 extends continuously as a single electrode along the vertical direction and the left and right directions of the page surface in the chip region surrounded by the element separation portion 9, and one end of the gate electrode 17 is connected to the gate pad 17A. For this reason, the area of the gate pad 17A can be reduced. Thus, it becomes possible to realize chip miniaturization.

Figure 13:
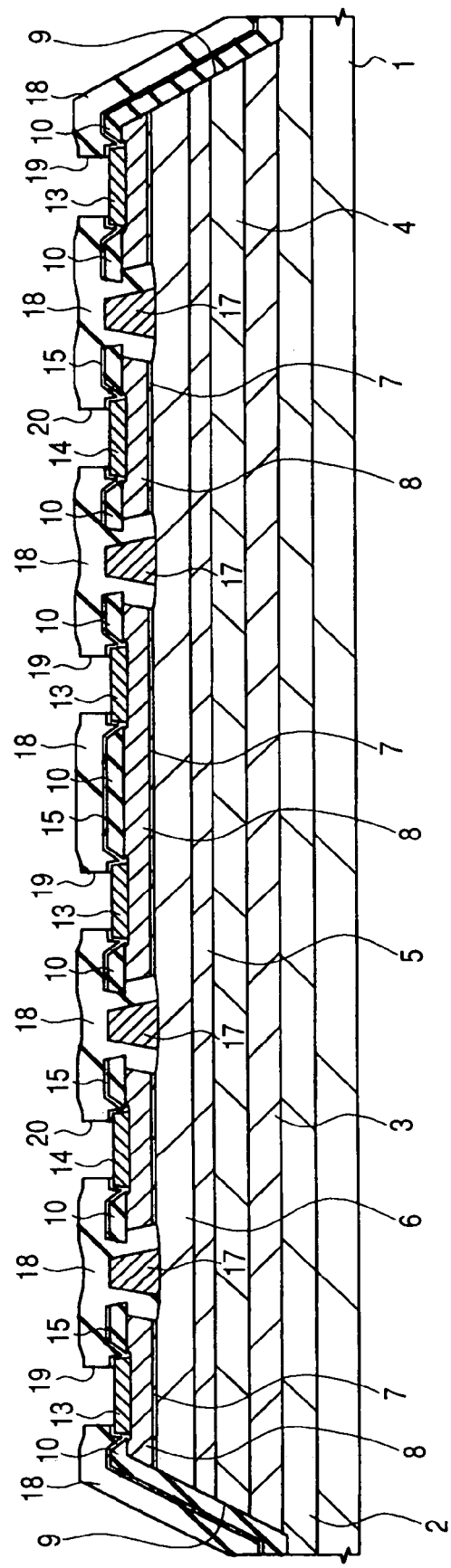
FIG. 13 is a cross-sectional diagram showing the semiconductor device during the fabrication process continued from FIG. 8.
Figure 14:
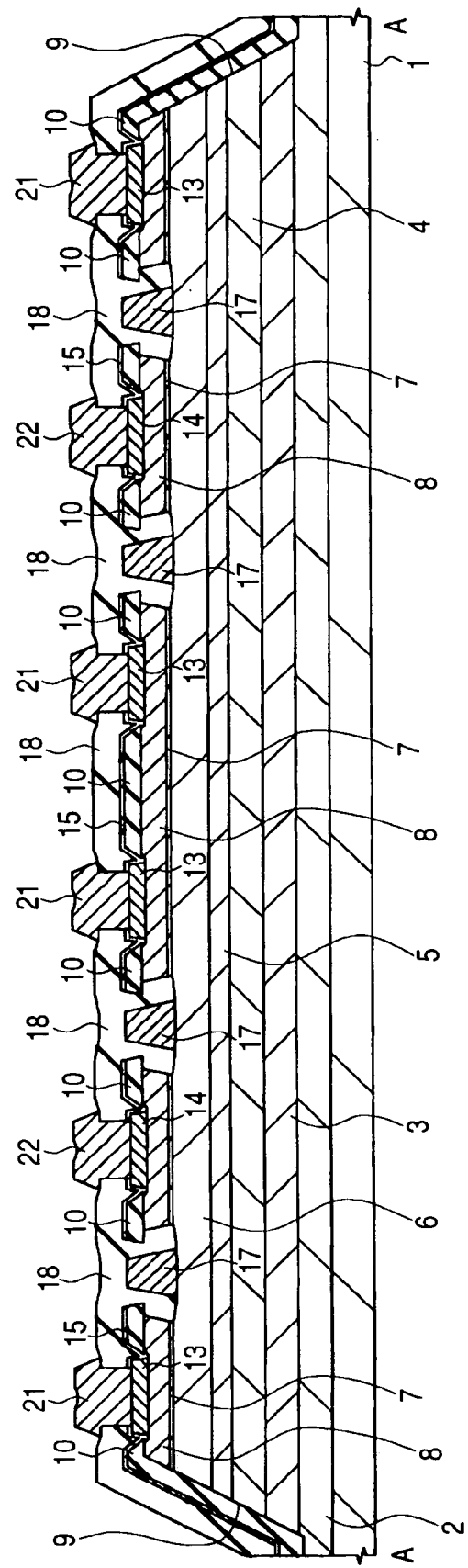
FIG. 14 is a cross-sectional diagram showing the semiconductor device during the fabrication process continued from FIG. 13.
Figure 15:
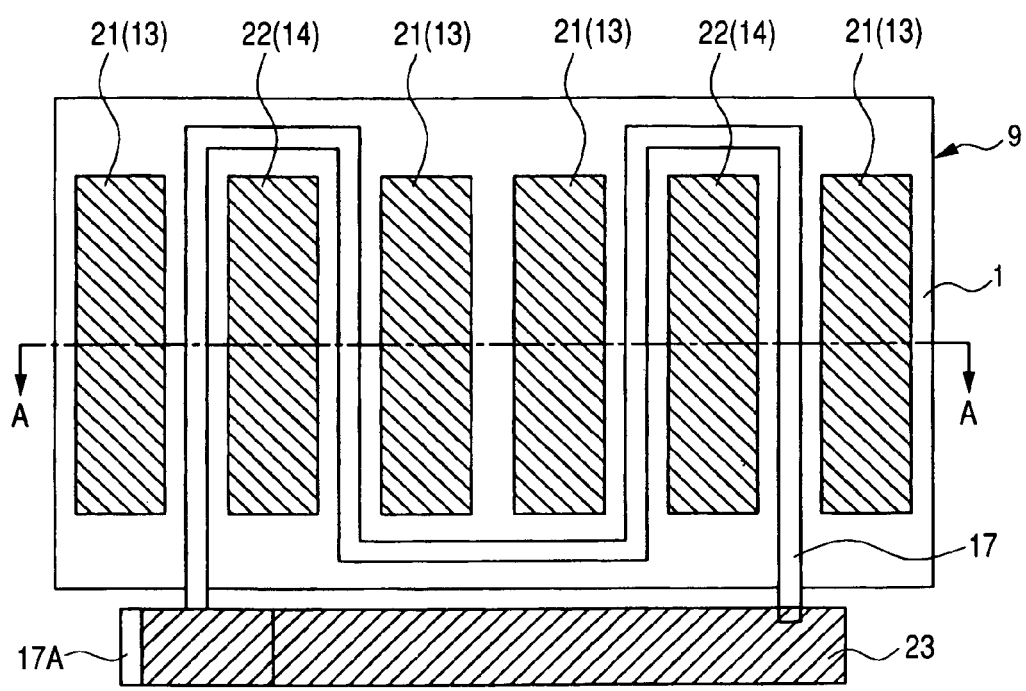
FIG. 15 is a plan diagram of the semiconductor device of the first embodiment of the invention during the fabrication process.

Next, as shown in FIG. 13, an interlayer insulating film 18 is formed by depositing a phospho-silicate glass (PSG) film on the substrate 1. Next, the interlayer insulating film 18 is etched using, as a mask, a photoresist film (not shown) that has been patterned by photolithography, so that open portions 19 that reach the source electrodes 13, open portions 20 that reach the drain electrodes 14 and open portions (not shown) that reach the gate pad 17A (see FIG. 8) are formed. Next, as shown in FIG. 14, Au wiring metal is deposited on the entire wafer surface by vapor deposition or sputtering, and after a photoresist film has been formed as a mask on the upper portion of the region where the wiring is formed, excessive metal is removed by dry etching (milling) so that wirings 21 to 23 (the wiring 23 is shown in FIG. 15) are formed. The wirings 21 and 22, and the wirings formed inside the open portions reaching the gate pad 17A, are respectively electrically connected to the source electrodes 13, the drain electrodes 14 and the gate electrode 17. Here, FIG. 15 shows a plan view of the chip region after the wirings 21 to 23 have been formed, and the cross section shown in FIG. 14 corresponds to the cross section along line A-A of FIG. 15. After the wirings 21 to 23 have been formed, the photoresist film is removed.

Figure 16:
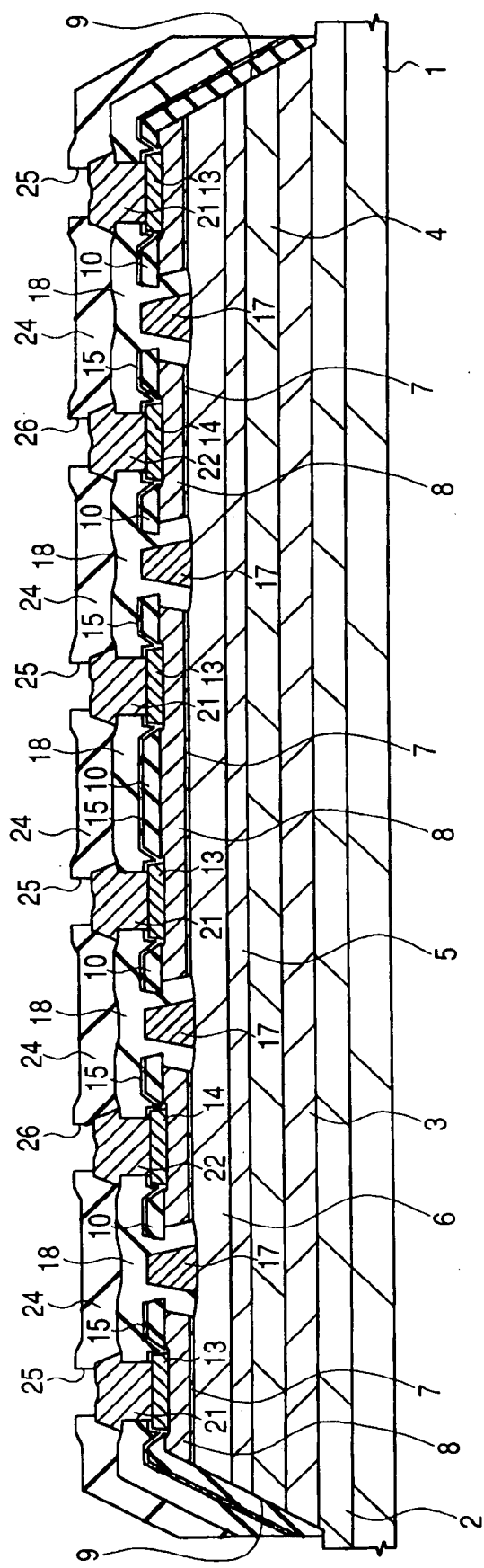
FIG. 16 is a cross-sectional diagram showing the semiconductor device during the fabrication process continued from FIG. 14.

Next, as shown in FIG. 16, an interlayer insulating film 24 is formed by, for example, depositing a silicon oxide film on the substrate 1. Next, the interlayer insulating film 24 is etched using, as a mask, a photoresist film that has been patterned by photolithography, so that open portions 25 reaching the wirings 21 and open portions 26 reaching the wirings 22 are formed.

Figure 17:
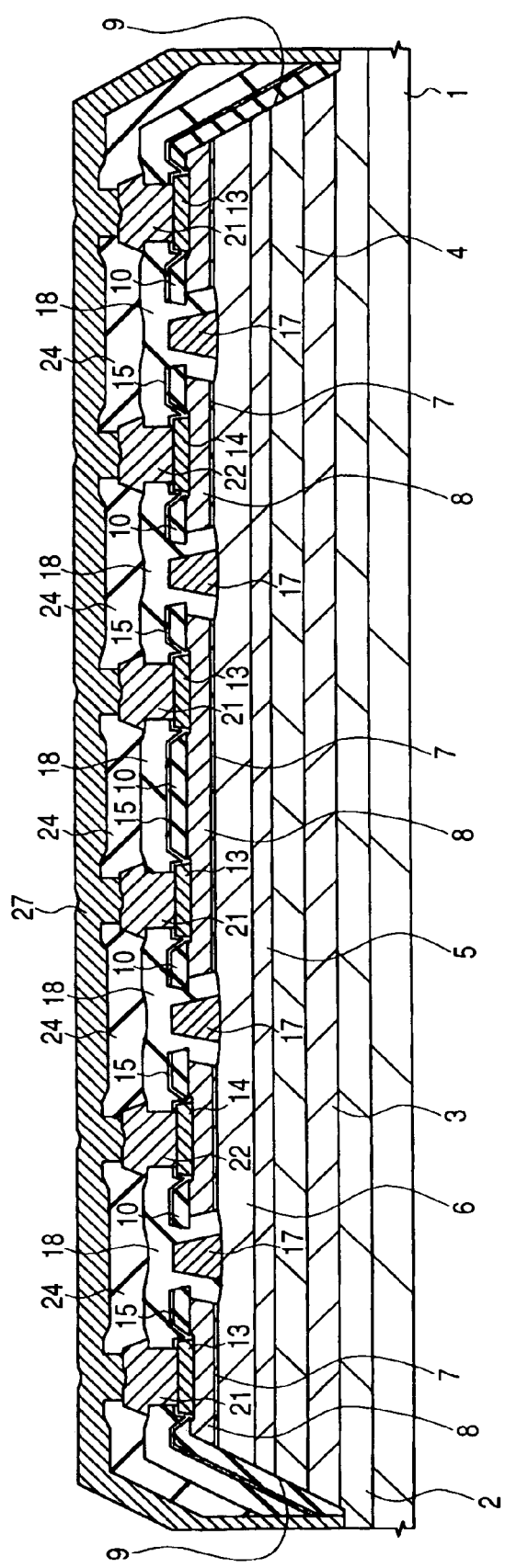
FIG. 17 is a cross-sectional diagram showing the semiconductor device during the fabrication process continued from FIG. 16.

Next, as shown in FIG. 17, an Mo/Au/Mo film 27 is deposited on the substrate 1, so that the open portions 25 and 26 are filled in with the Mo/Au/Mo film 27.

Figure 18:
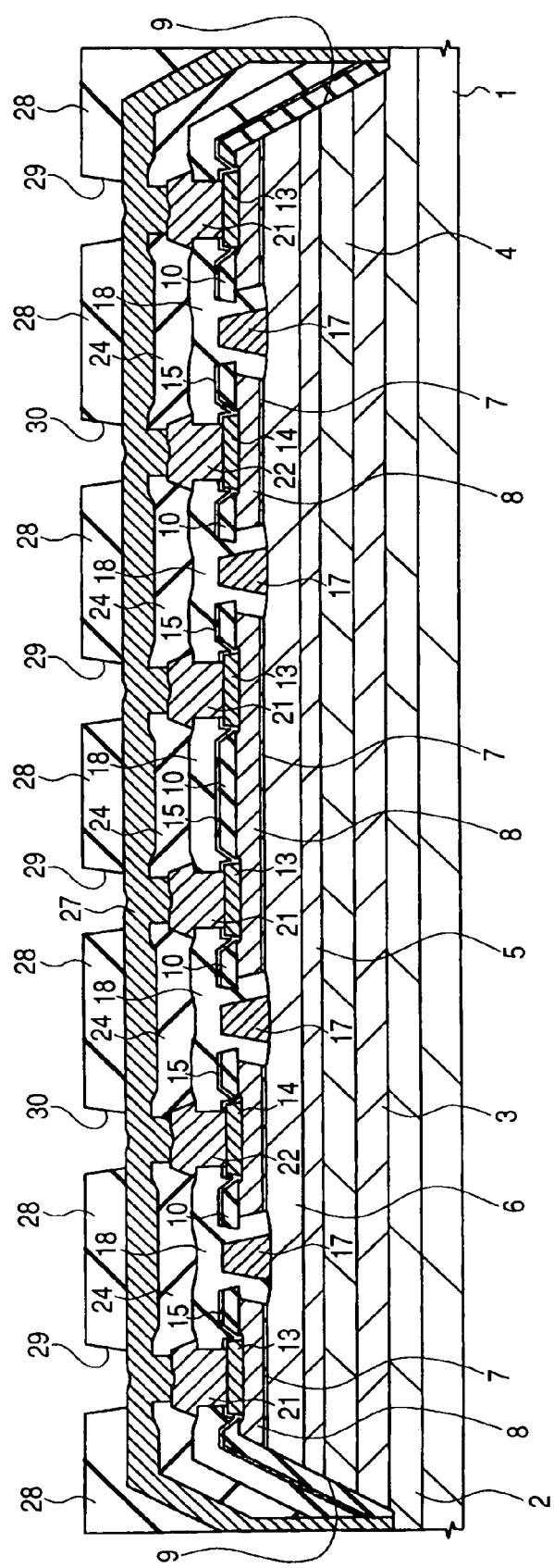
FIG. 18 is a cross-sectional diagram showing the semiconductor device during the fabrication process continued from FIG. 17.

Next, as shown in FIG. 18, a photoresist film 28 is formed on the Mo/Au/Mo film 27. Next, the photoresist film 28 is patterned by photolithography, so that open portions 29 and 30 reaching the Mo/Au/Mo film 27 are formed.

Figure 19:
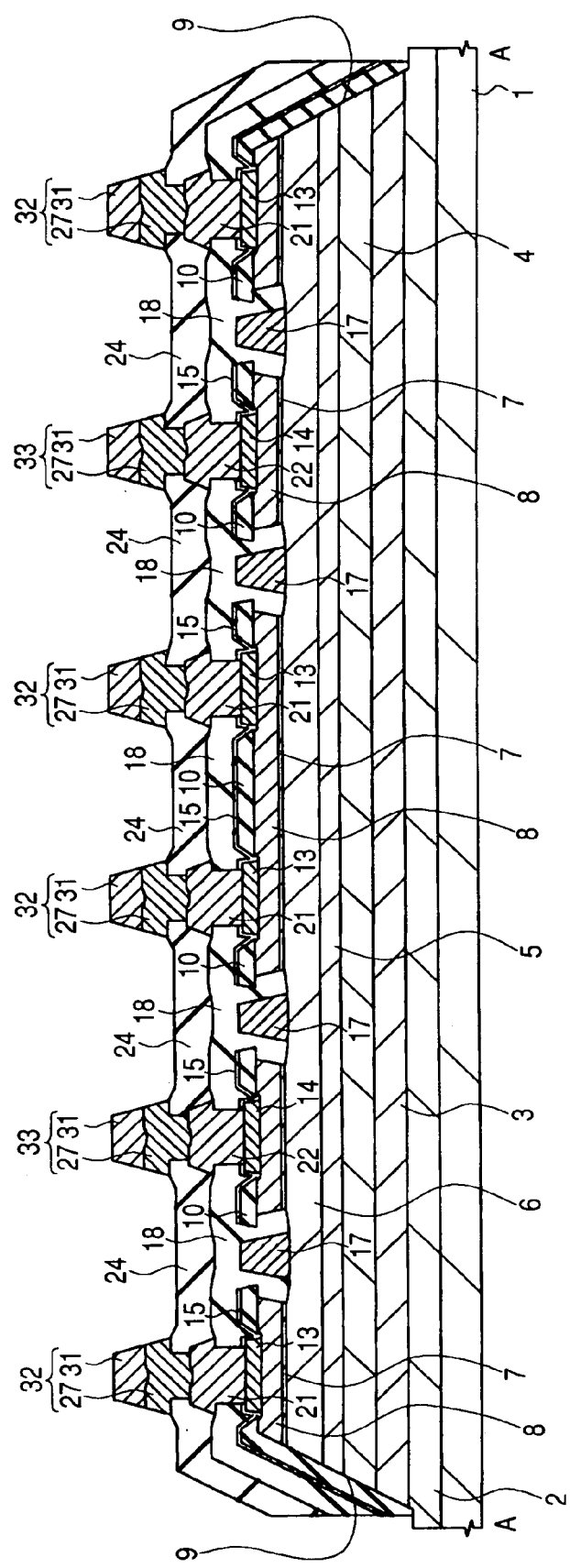
FIG. 19 is a cross-sectional diagram showing the semiconductor device during the fabrication process continued from FIG. 18.
Figure 20:
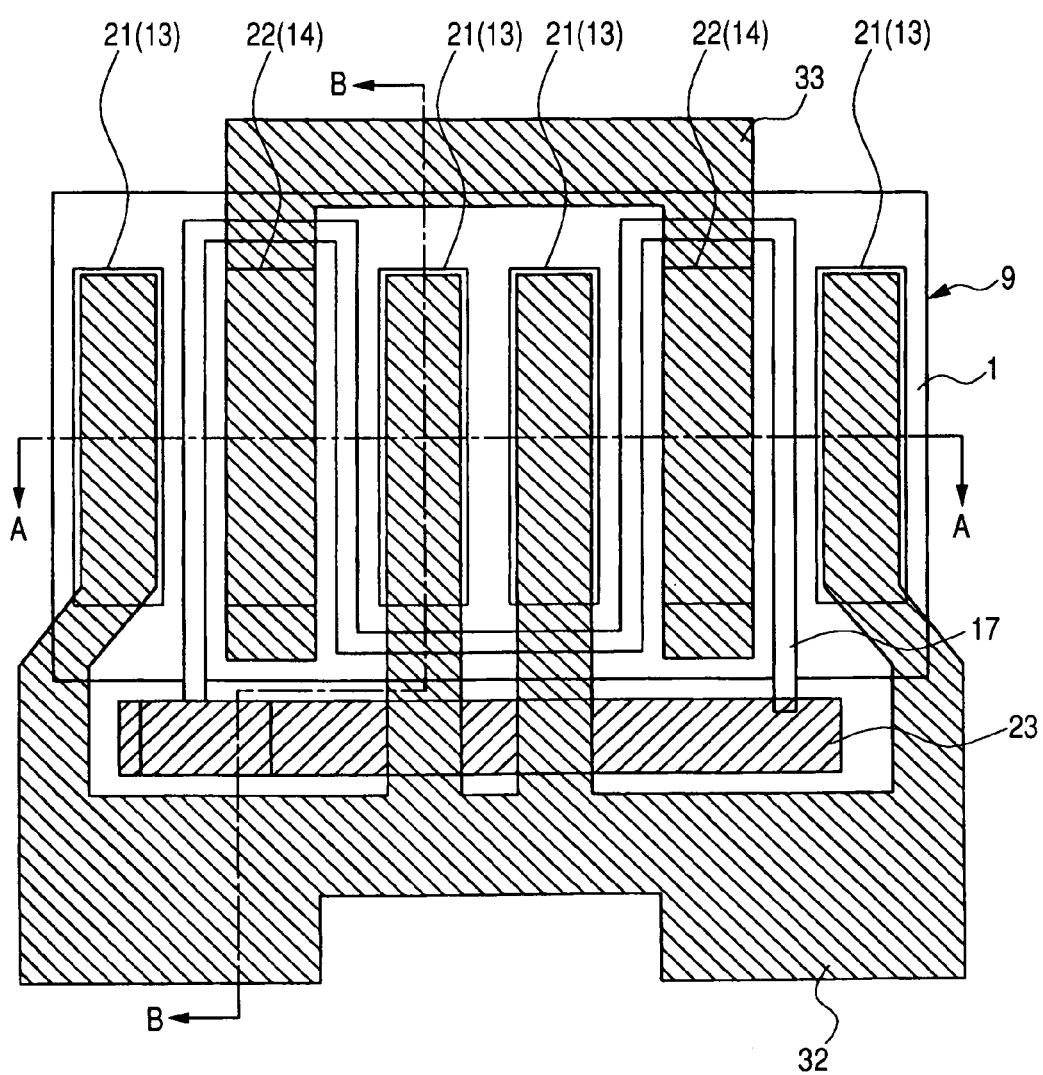
FIG. 20 is a plan diagram of the semiconductor device of the first embodiment of the invention during the fabrication process.
Figure 21:
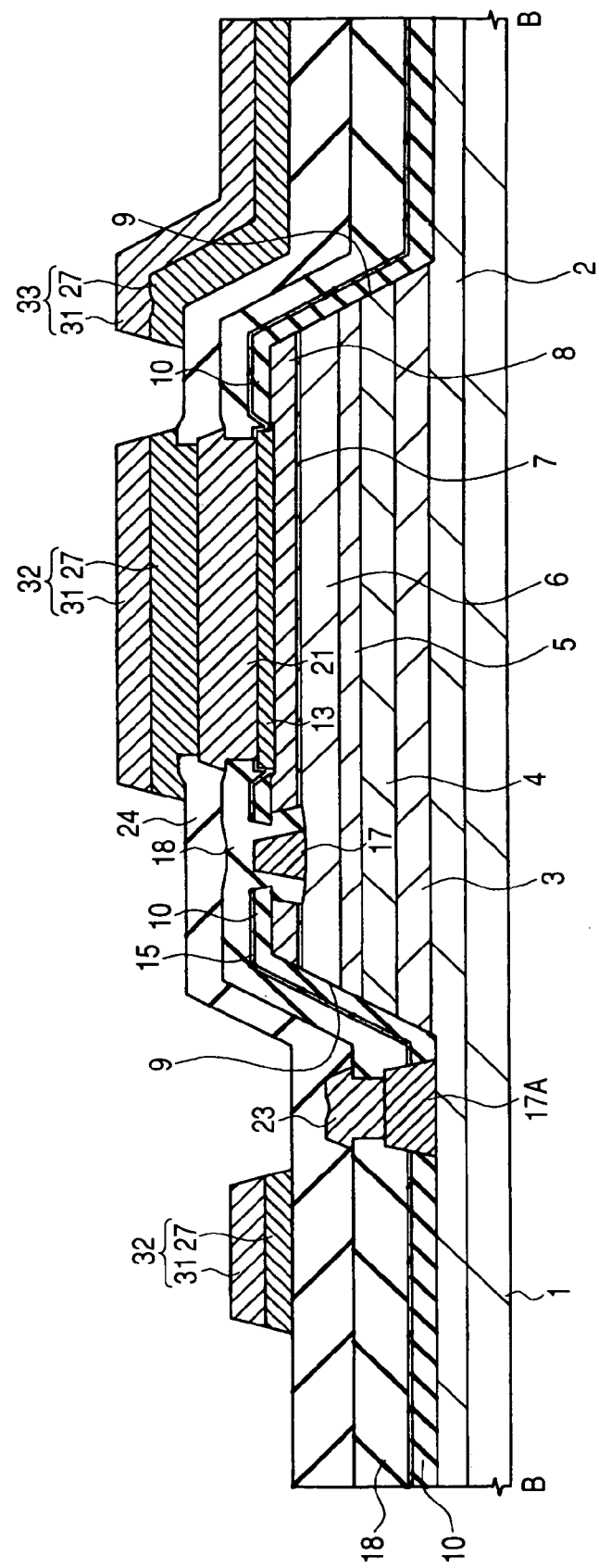
FIG. 21 is a cross-sectional diagram of the semiconductor device of the first embodiment of the invention during the fabrication process.

Next, as shown in FIG. 19, an Au film 31 with a film thickness of about 5 μm is formed inside the open portions 29 and 30 by plating. Next, after the photoresist film 28 has been removed, the Mo/Au/Mo film 27 is etched using the Au film 31 as a mask, and wirings 32 and 33 comprising the Au film 31 and the Mo/Au/Mo film 27 are formed. The wirings 32 and 33 are respectively electrically connected to the wirings 21 and 22. Here, FIG. 20 shows a plan view of the chip region after the wirings 32 and 33 have been formed, and the cross section shown in FIG. 19 corresponds to the cross section along line A-A of FIG. 20. Also, FIG. 21 shows the cross section along line B-B of FIG. 20. In FIG. 20, the wirings 23, 32 and 33 are represented with hatching. Although not shown, another wiring that is the same as these wirings 32 and 33 is formed when the wirings 32 and 33 are formed, and this wiring is electrically connected to the wiring 23 (see FIG. 15).

Figure 22:
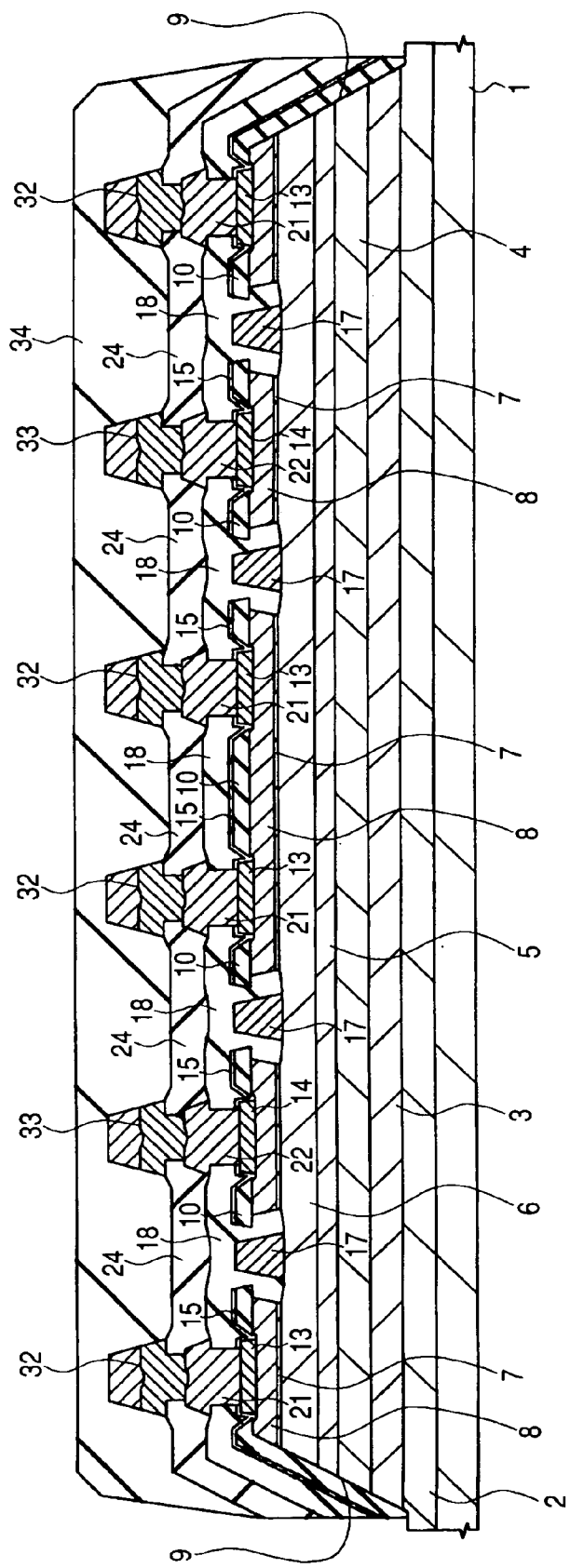
FIG. 22 is a cross-sectional diagram showing the semiconductor device during the fabrication process continued from FIG. 19.
Figure 23:
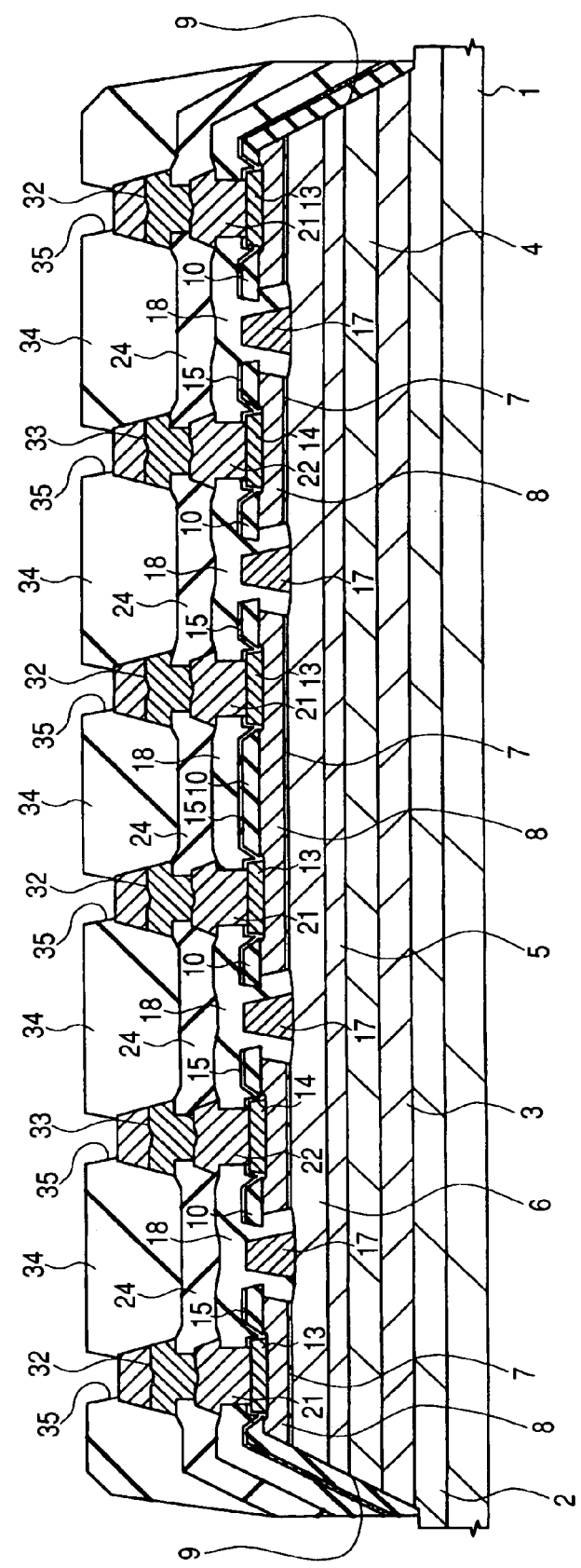
FIG. 23 is a cross-sectional diagram showing the semiconductor device during the fabrication process continued from FIG. 22.
Figure 24:
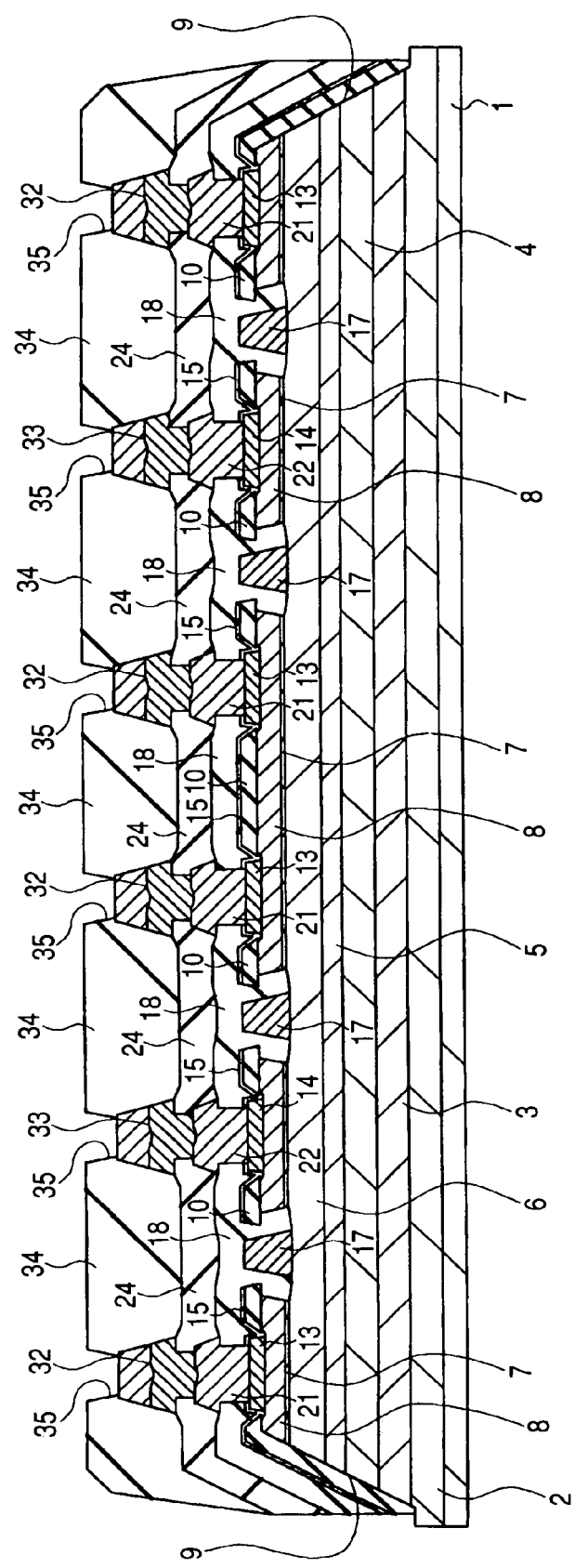
FIG. 24 is a cross-sectional diagram showing the semiconductor device during the fabrication process continued from FIG. 23.

Next, as shown in FIG. 22, a polyimide film 34 is applied to the substrate 1 to cover the wirings 32 and 33 therewith. Next, as shown in FIG. 23, the polyimide film 34 is etched using, as a mask, a photoresist film (not shown) that has been patterned by photolithography, so that open portions 35 reaching the wirings 32 and 33 are formed. Thereafter, as shown in FIG. 24, the undersurface of the substrate 1 is grinded so that the substrate 1 is thinned to a thickness of about 160 μm, whereby the semiconductor device of the first embodiment is fabricated.

Figure 25:
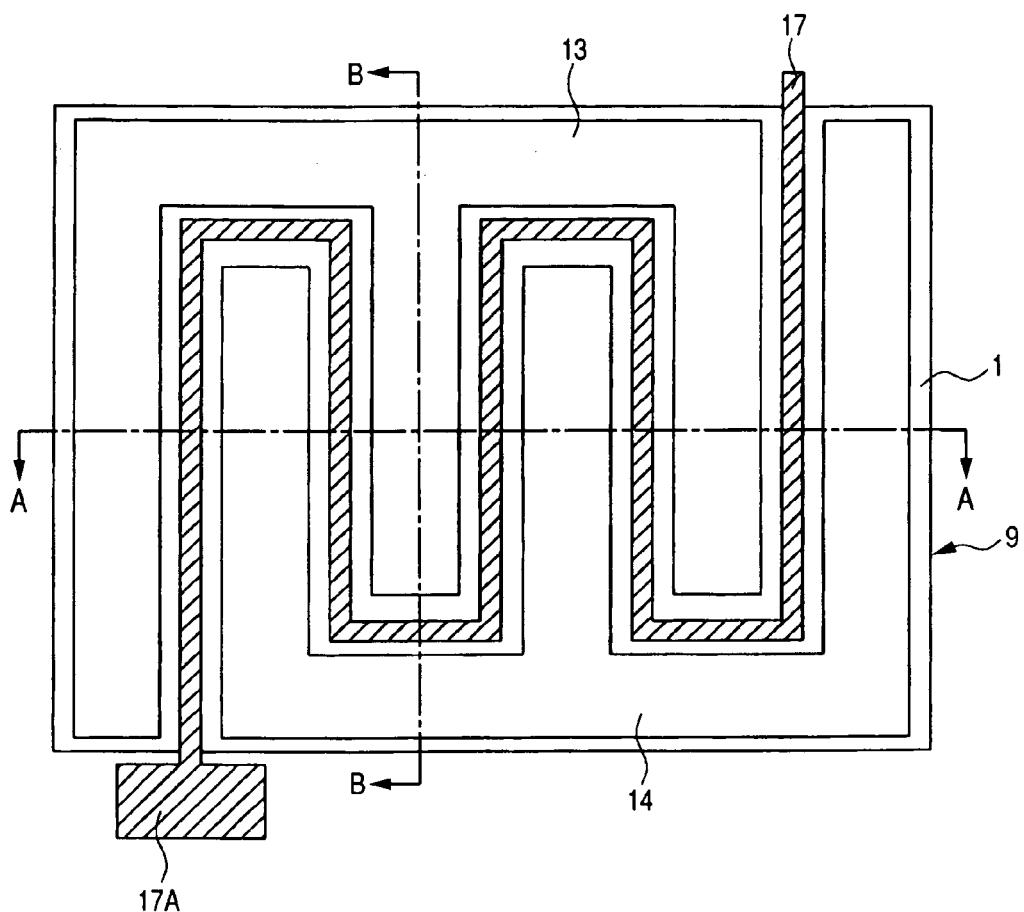
FIG. 25 is a plan diagram of the semiconductor device of the first embodiment of the invention during the fabrication process.
Figure 26:
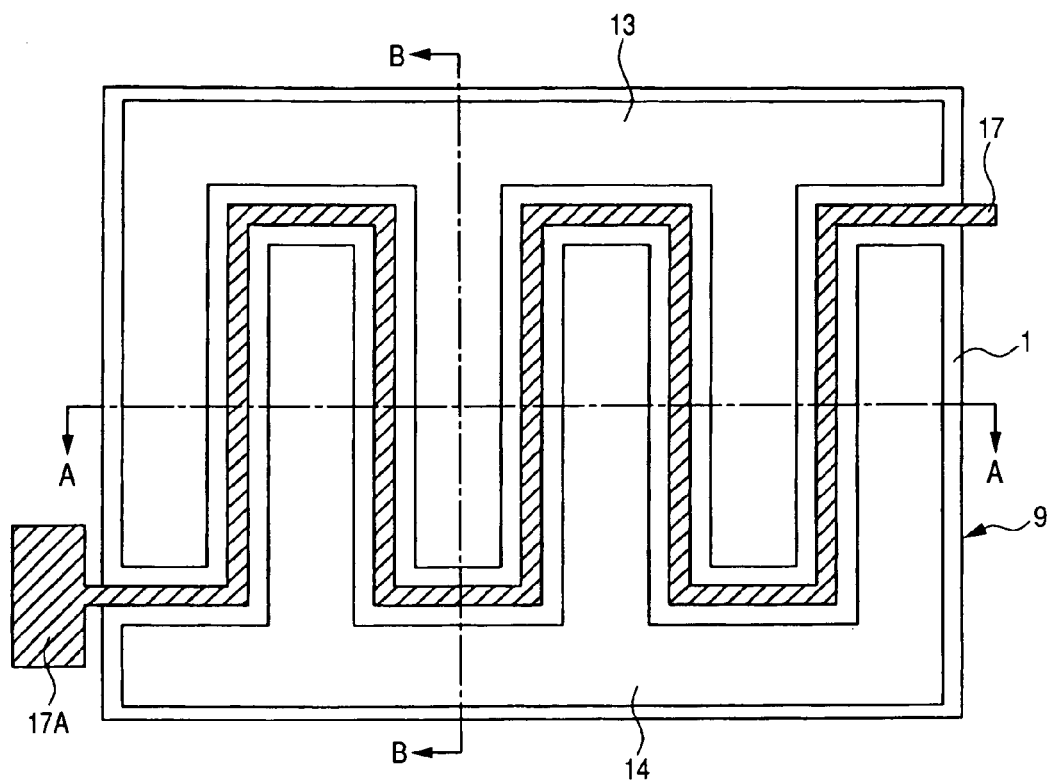
FIG. 26 is a plan diagram of the semiconductor device of the first embodiment of the invention during the fabrication process.
Figure 27:
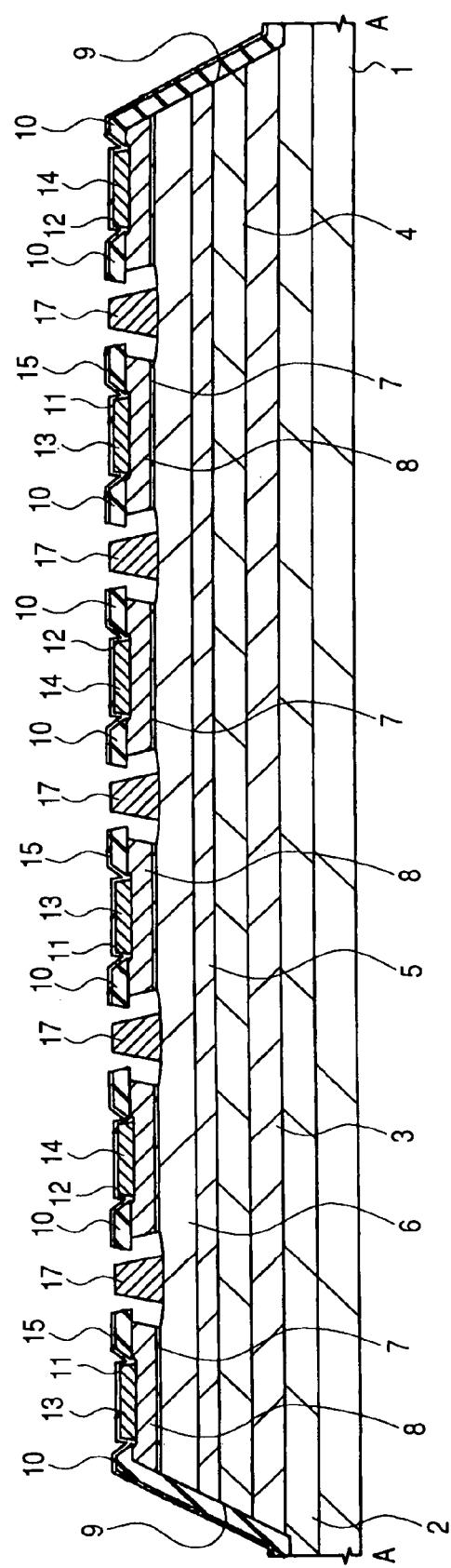
FIG. 27 is a cross-sectional diagram of the semiconductor device of the first embodiment of the invention during the fabrication process.
Figure 28:
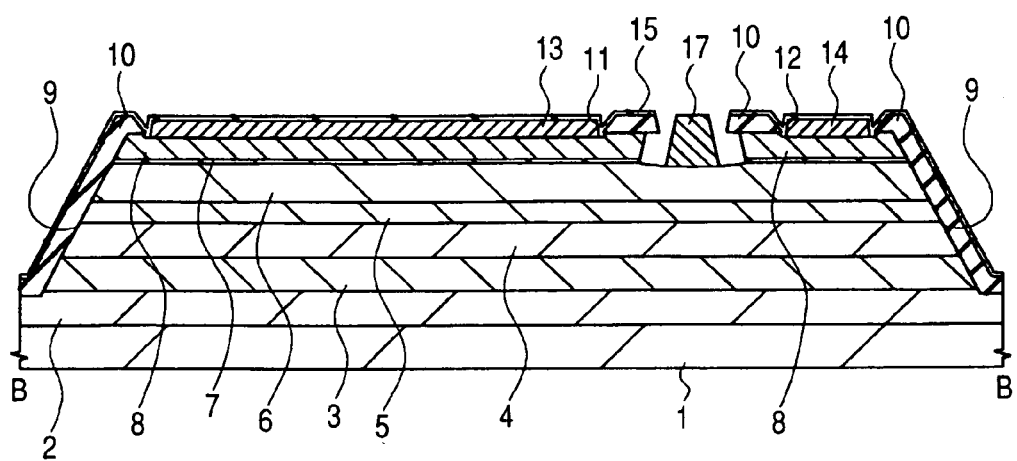
FIG. 28 is a cross-sectional diagram of the semiconductor device of the first embodiment of the invention during the fabrication process.

The source electrode 13 and the drain electrode 14 may be formed to have a comb-tooth-type plan pattern as shown in FIG. 25 or FIG. 26, with the comb-tooth-type patterns being alternately disposed so that the gate electrode 17 is disposed between the comb-tooth-type patterns. FIGS. 27 and 28 respectively show the cross section along line A-A and the cross section along line B-B of FIG. 25 or FIG. 26. In FIGS. 25 and 26, the gate electrode 17 is represented with hatching. By configuring the source electrode 13, the drain electrode 14 and the gate electrode 17 to have a plan pattern such as shown in FIG. 25, the portions of the gate electrode 17 facing the leading end portions of the comb-tooth-type patterns can be regarded as being included in the effective gate width so that it becomes possible to increase the size of the total gate width in comparison to the case where, for example, they are configured to have the plan pattern that was described using FIG. 8. It becomes possible to further reduce the ON resistance of the HEMT due to the total gate width becoming larger, because the ON resistance of the HEMT is the sum of the source resistance, the drain resistance and the channel resistance.

Figure 29:
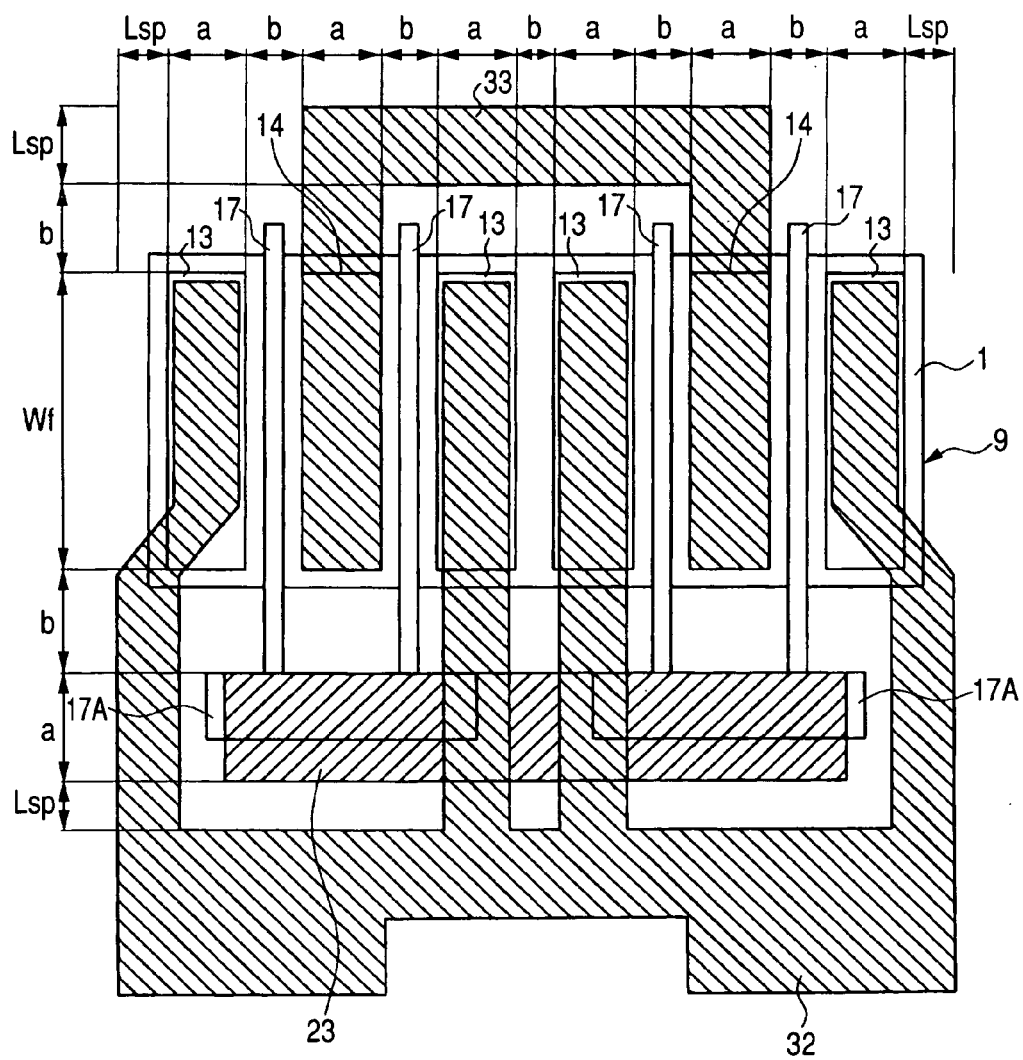
FIG. 29 is a plan diagram for describing an example of a structure of a semiconductor device that the present inventors studied.
Figure 30:
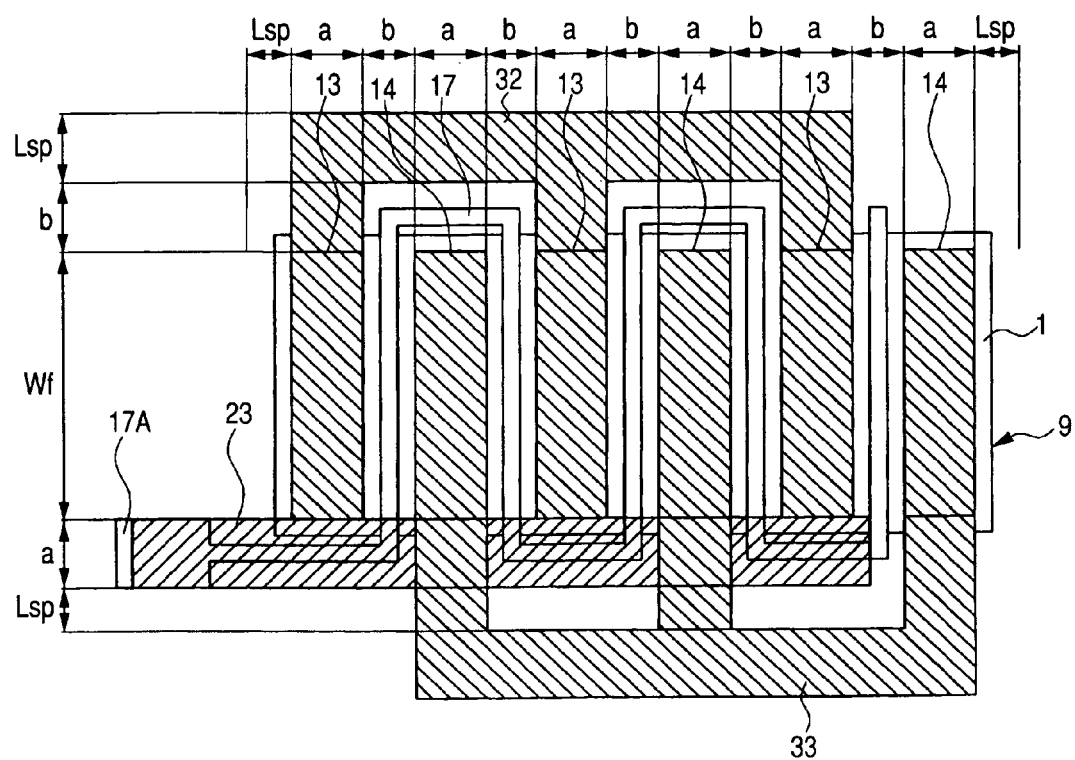
FIG. 30 is a plan diagram for describing an example of a structure of a semiconductor device that the present inventors studied.
Figure 31:
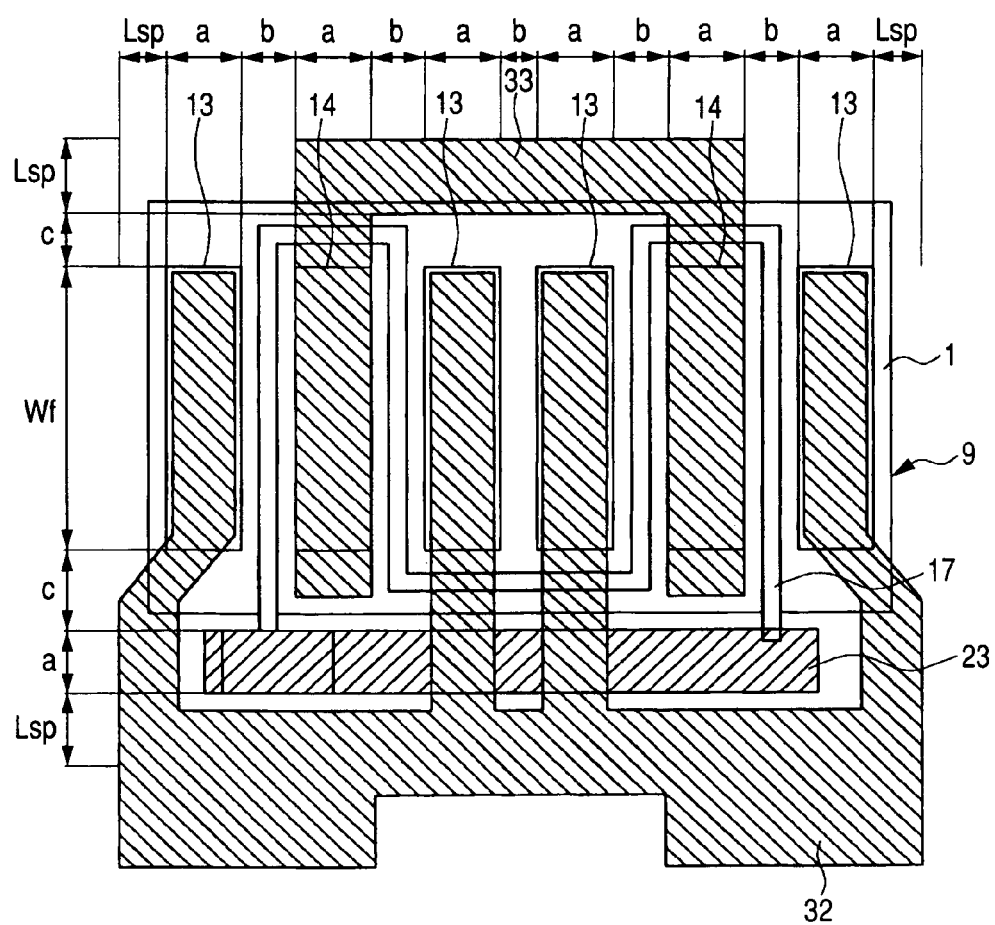
FIG. 31 is a plan diagram of the semiconductor device of the first embodiment of the invention.
Figure 32:
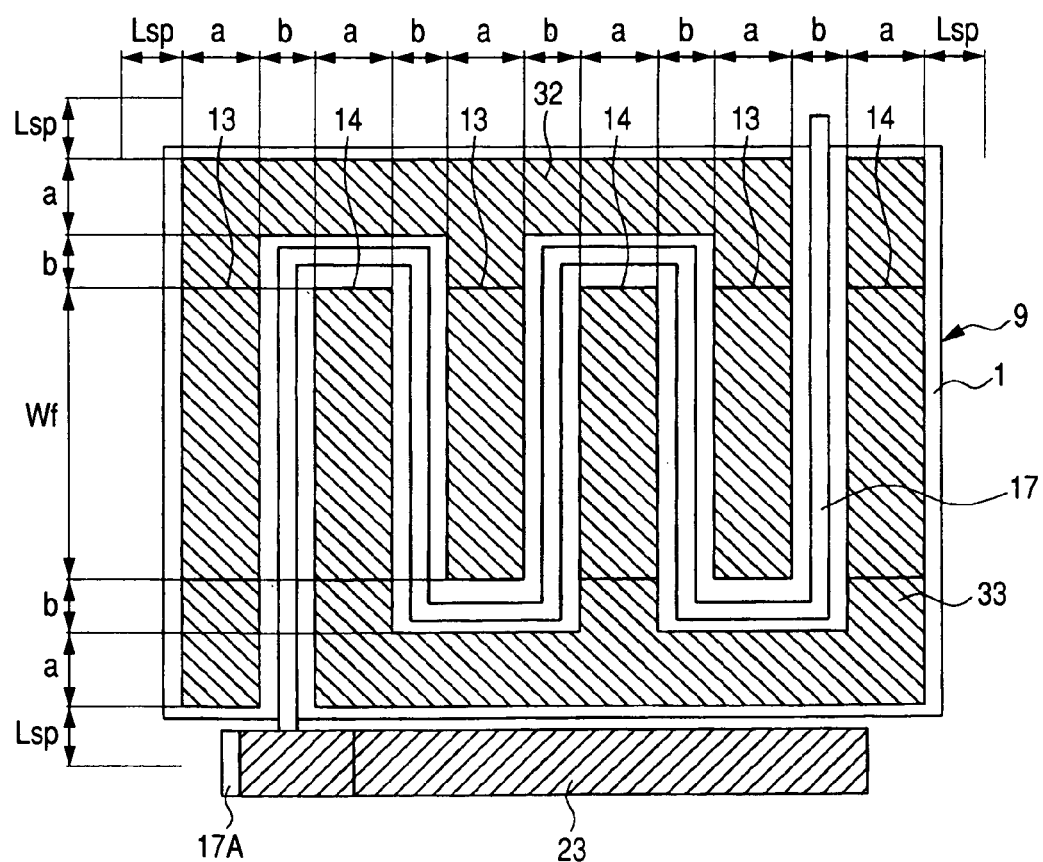
FIG. 32 is a plan diagram of the semiconductor device of the first embodiment of the invention.
Figure 33:
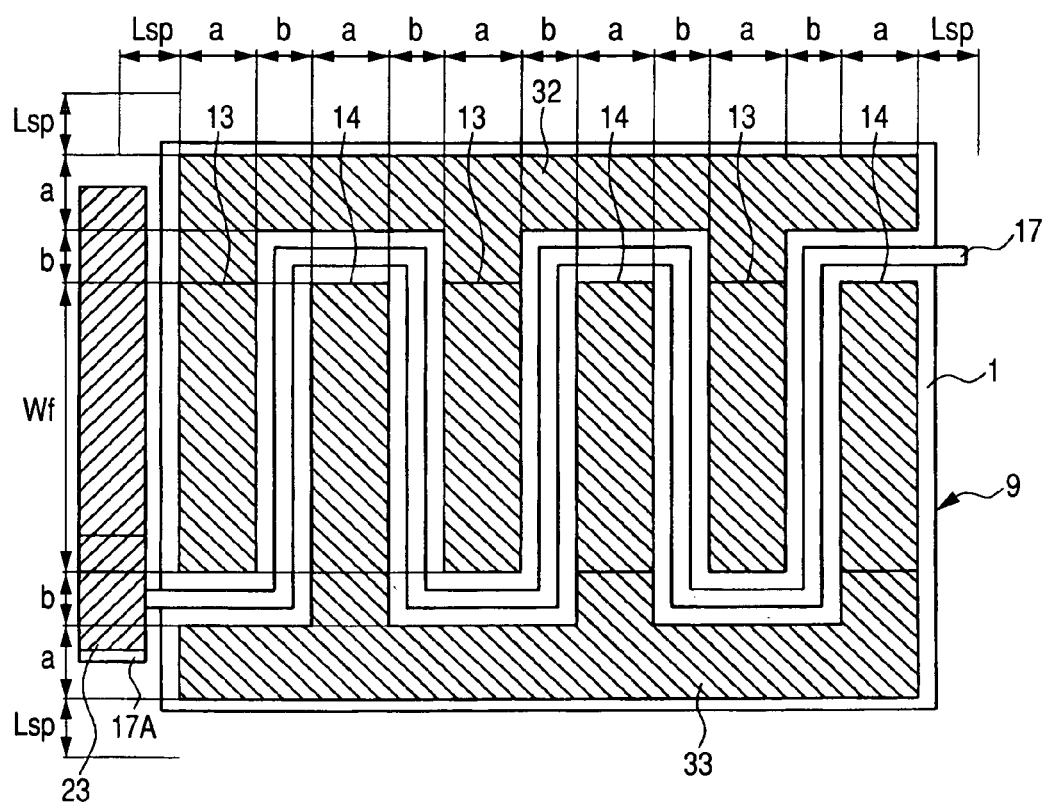
FIG. 33 is a plan diagram of the semiconductor device of the first embodiment of the invention.

Here, the present inventors investigated the relation between the area of a chip where a HEMT is formed, the ON resistance of the HEMT and the capacity at the time of pinch off. The plan patterns shown in FIGS. 29 and 30 are ones that the present inventors studied and compared with the plan patterns (see FIGS. 20, 25 and 26) of the HEMT of the first embodiment, and are ones where the dimensions of each portion are described. FIGS. 31, 32 and 33 are diagrams where the dimensions of each portion are described in regard to the plan patterns of the HEMT of the first embodiment shown in FIGS. 20, 25 and 26. In FIGS. 29 to 33, the wirings 23, 32 and 33 are represented with hatching. Also, the dimensions of each portion in the plan patterns shown in FIGS. 29 to 33 are defined as follows. Namely, it will be assumed that a unit gate finger (the portion of the gate electrode 17 disposed between the source electrodes 13 and the drain electrodes 14) length Wf is 50 μm or 150 μm. It will also be assumed that a width a of the wiring 23 electrically connected to the gate electrode 17 is 5 μm. It will also be assumed that the width of each of the source electrodes 13 and the drain electrodes 14 is the same a as the wiring 23, or 5 μm. An interwiring space b will be 5 μm. An interwiring space c will be 7.5 μm. An interwiring space Lsp will be 5 μm. A gate finger number n when the total gate length in the chip is 3 mm will be 60 when the unit gate finger length Wf is 50 μm and 20 when the unit gate finger length Wf is 150 μm. An ON resistance R per unit gate width will be 1 Ω·mm (=1000 Ω·μm). A gate capacity C0 at the pinch off time per unit gate width will be 0.1 pF/mm (=0.0001 pF/μm). Gate capacities Coff and Coff' per unit length at the pinch off time of the gate electrode 17 other than the gate fingers will be represented by α×C0, with α being 0.2. The chip area will be represented by S, the ON resistance of the HEMT will be represented by Ron, a total gate width Wg in the examples of FIGS. 29 to 31 will be represented by n×Wf, a total gate width Wgeff in the examples of FIGS. 32 and 33 will be represented by (Wf+a+b)×n+a, and the total capacity at the pinch off time of the HEMT will be represented by Ctotal.

In the case of the plan pattern shown in FIG. 29 (hereinafter referred to as "pattern 1"), the chip area S, the ON resistance Ron of the HEMT and the total capacity Ctotal at the pinch off time of the HEMT can be respectively expressed by S=(Wf+a+2×b+2×Lsp)×{(a+b)×n+a+2×Lsp}, Ron=R/Wg, and Ctotal=C0×Wg+Coff'×{(a+b+2×b)×n/2}. When Wf Ls 50 μm, S=46125 μm², Ron=0.34 Ω, and Ctotal=0.312 pF. When Wf is 150 μm, S=37625 μm², Ron=0.41 Ω, and Ctotal=0.304 pF.

In the case of the plan pattern shown in FIG. 30 (hereinafter referred to as "pattern 2"), the chip area S, the ON resistance Ron of the HEMT and the total capacity Ctotal at the pinch off time of the HEMT can be respectively expressed by S=(Wf+2×b+2×Lsp)×{(a+b)×n+a+2×Lsp}, Ron=R/Wg, and Ctotal=C0×Wg+Coff×{(a+b+2×b)×n}. When Wf is 50 μm, S=43050 μm², Ron=0.34 Ω, and Ctotal=0.324 pF. When Wf is 150 μm, S=0.36550 μm², Ron=0.41 Ω, and Ctotal=0.308 pF.

In the case of the plan pattern shown in FIG. 31 (hereinafter referred to as "pattern 3"), the chip area S, the ON resistance Ron of the HEMT and the total capacity Ctotal at the pinch off time of the HEMT can be respectively expressed by S=(Wf+2×b+2×Lsp)×{(a+b)×n+a+2×Lsp}, Ron=R/Wg, and Ctotal=C0×Wg+Coff×{(a+b+2×b)×n}. When Wf is 50 μm, S=43050 μm², Ron=0.34 Ω, and Ctotal=0.324 pF. When Wf is 150 μm, S=36550 μm², Ron=0.41 Ω, and Ctotal=0.308 pF.

In the case of the plan pattern shown in FIG. 32 (hereinafter referred to as "pattern 4"), the chip area S, the ON resistance Ron of the HEMT and the total capacity Ctotal at the pinch off time of the HEMT can be respectively expressed by S=(Wf+2×a+2×b+2×Lsp)×{(a+b)×n+a+2×Lsp}, Ron=R/Wgeff, and CtotaL=C0×Wgeff. When Wf is 50 μm, S=49200 μm², Ron=0.29 Ω, and Ctotal=0.3605 pF. When Wf is 150 μm, S=38700 μm², Ron=0.39 Ω, and Ctotal=0.3205 pF.

In the case of the plan pattern shown in FIG. 33 (hereinafter referred to as "pattern 5"), the chip area S, the ON resistance Ron of the HEMT and the total capacity Ctotal at the pinch off time of the HEMT can be respectively expressed by S=(Wf+2×a+2×b+2×Lsp)×{(a+b)×n+a+2×

Lsp}, Ron=R/Wgeff, and Ctotal=C0×Wgeff. When Wf is 50 µm², S=49200 µm², Ron=0.29 Ω, and Ctotal=0.3605 pF. When Wf is 150 µm, S=38700 µm², Ron=0.39 Ω, and Ctotal=0.3205 pF.

Figure 35:
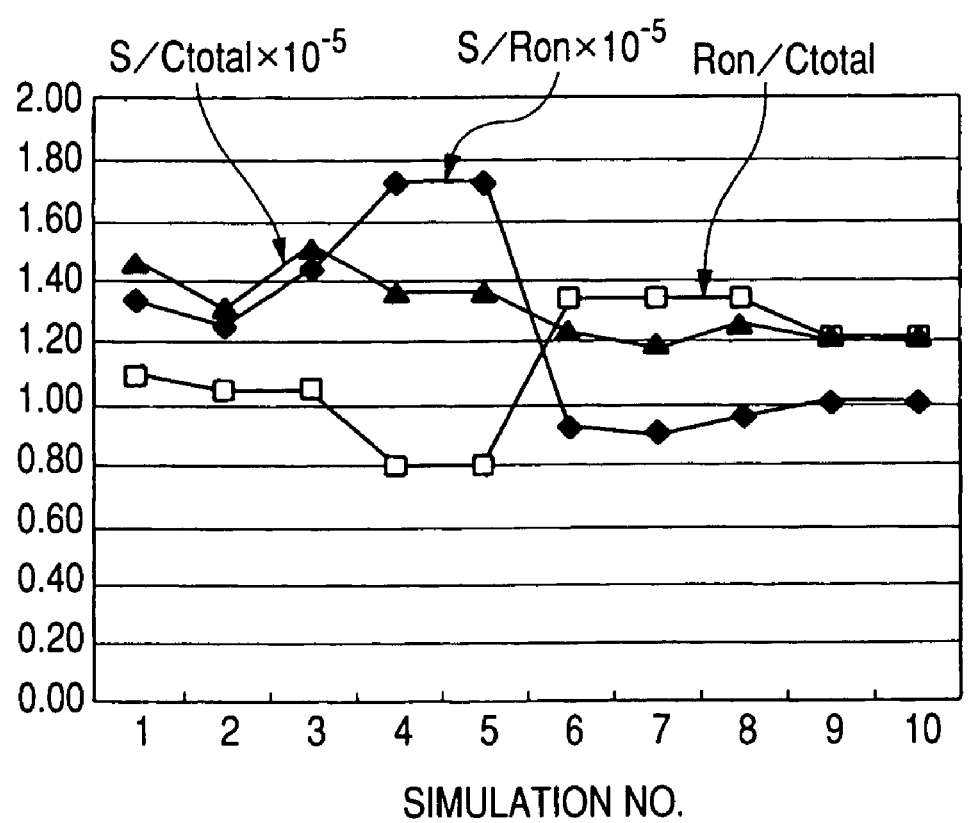
FIG. 35 is a graph showing the respective numerical values shown in FIG. 34.

FIG. 34 is a table showing the numerical values of S/Ron, Ron/Ctotal and S/Ctotal calculated from the chip areas S, the ON resistances Ron and the total capacities Ctotal at the pinch off time of the HEMTs in regard to patterns 1 to 5. FIG. 35 is a graph showing these numerical values. In consideration of radio frequency characteristics, it is preferable for Ron/Ctotal to be small, and particularly preferable for Ron/Ctotal to be smaller than 1. As shown in FIGS. 34 and 35, Ron/Ctotal is smaller than 1 in pattern 4 and pattern 5, which are the plan patterns of the HEMT of the first embodiment, and a HEMT including pattern 4 or pattern 5 can be configured so that it is preferable to use as the aforementioned switching element.

Figure 36:
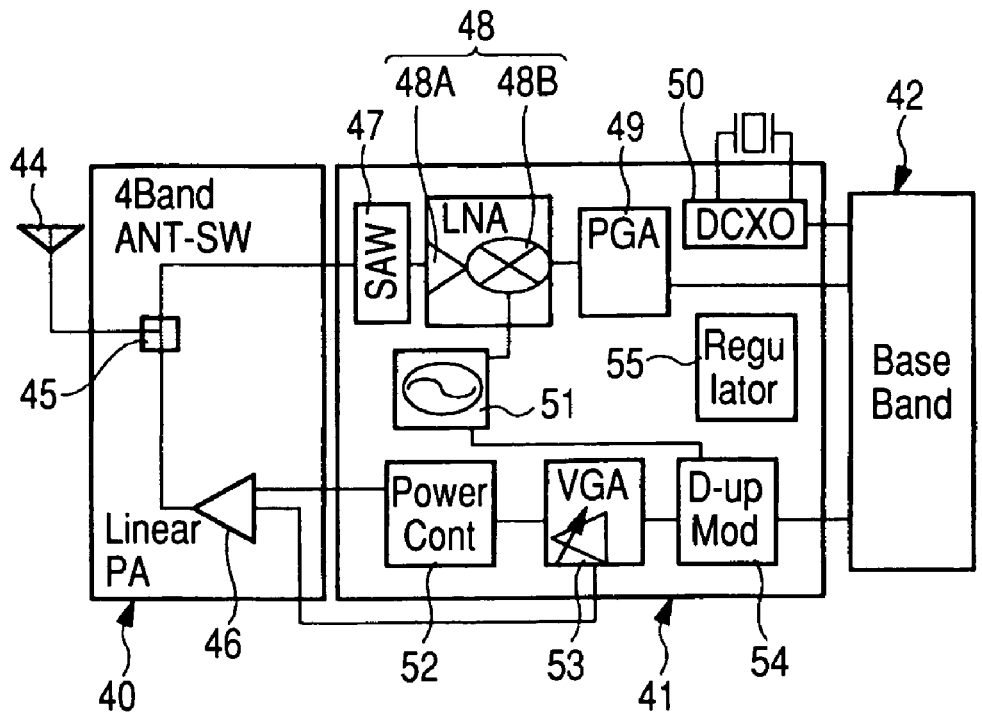
FIG. 36 is a block diagram of a radio frequency module including the semiconductor device of the first embodiment of the invention.

FIG. 36 is a block diagram of the aforementioned radio frequency module. As shown in FIG. 36, the radio frequency module is formed by a high power amplifier (HPA) unit 40, a radio frequency IC unit 41 and a baseband LSI unit 42. The EPA unit 40 is formed by a transmission/reception switching-use switch circuit 45, which is electrically connected to an antenna 44 for transmitting and receiving signal waves, and a power amp module 46 that amplifies transmission signals. The radio frequency IC unit 41 is formed by a radio frequency filter 47 that removes unnecessary waves from reception signals, a low noise amplifier (LNA) 48 that amplifies reception signals, a programmable gain amplifier (PGA) 49, a digital controlled crystal oscillator (DCXO) 50, a radio frequency voltage controlled oscillator (RFVCO) 51, an output controller 52, a variable gain amplifier (VGA) 53, a modulation circuit 54 and a regulator 55. The LNA 48 is formed by an amplifier 48A and a demodulator circuit 48B.

Figure 37:
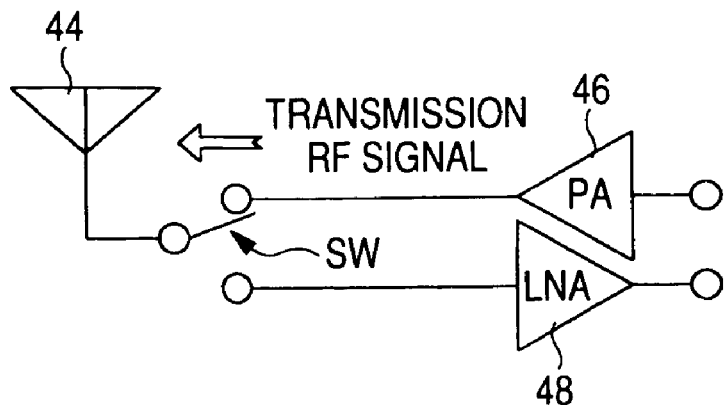
FIG. 37 is an explanatory diagram showing the operation of a transmission/reception switching-use switch circuit included in an HPA unit shown in FIG. 36.

FIG. 37 shows the operation of the transmission/reception switching-use switch circuit 45 included in the HPA unit shown in FIG. 36. The transmission/reception switching-use switch circuit 45 corresponds to the switch SW shown in FIG. 37. For example, in a case where the transmission/reception-use antenna 44 is electrically connected by the switch SW to the power amp module 46 included in the transmission circuit, the transmission/reception-use antenna 44 functions as a transmission-use antenna, and transmission RF signals are transmitted from the power amp module 46 to the transmission/reception-use antenna 44.

Figure 38:
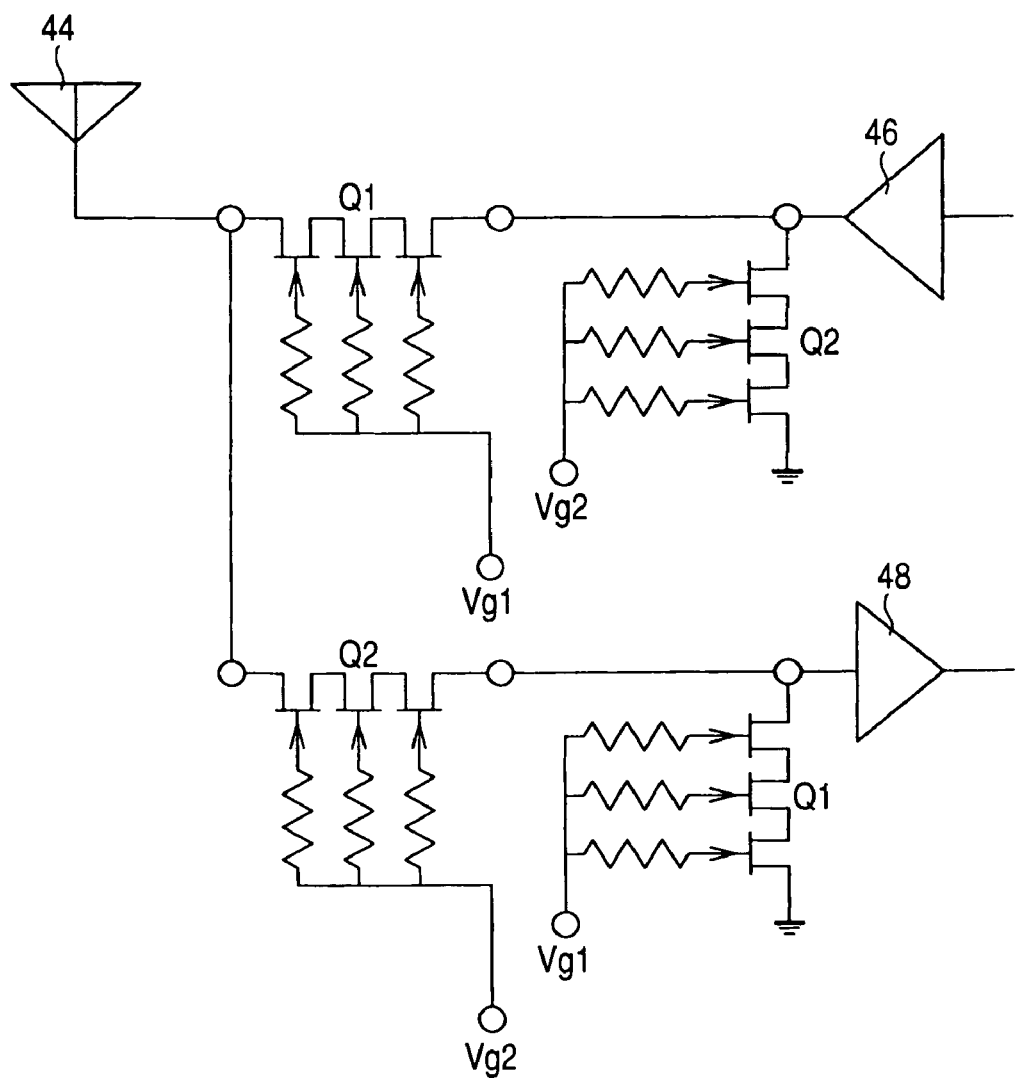
FIG. 38 is a circuit diagram showing in further detail the operation of the transmission/reception switching-use switch circuit shown in FIG. 37.
Figure 39:
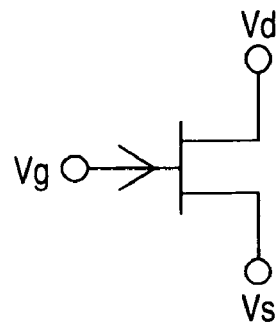
FIG. 39 is a circuit diagram of the HEMT that the semiconductor device of the first embodiment of the invention includes.
Figure 40:
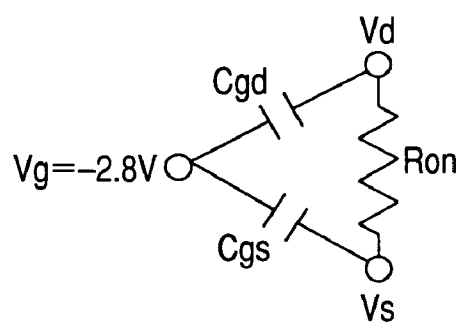
Figure 41:
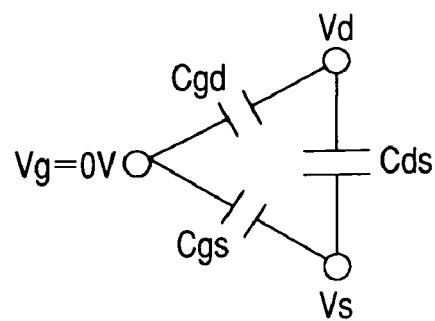
FIG. 41 is an equivalent circuit diagram when the HEMT that the semiconductor device of the first embodiment of the invention includes is OFF.

In the first embodiment, the switch SW is formed by the aforementioned HEMT of the first embodiment. As shown in FIG. 38, the switch SW is formed by two HEMTs Q1 and two HEMTs Q2. The HEMTs Q1 and the HEMTs Q2 are never turned ON at the same time: when one is ON, the other is OFF. Namely, when a voltage Vg1 is applied to gates of the two HEMTs Q1 (when the HEMTs Q1 are ON), a voltage is not applied to the gates of the two HEMTs Q2 (the HEMTs Q2 are OFF), and the transmission RF signals are transmitted from the power amp module 46 to the transmission/reception-use antenna 44. When a voltage Vg2 is applied to gates of the two HEMTs Q2 (when the HEMTs Q2 are ON), a voltage is not applied to the gates of the two HEMTs Q1 (the HEMTs Q1 are OFF), and the reception RF signals are transmitted from the transmission/reception-use antenna 44 to the LNA 48. Also, with respect to the HEMTs Q1 and Q2 of the first embodiment that can be shown with the circuit diagram shown in FIG. 39, all of the drain bias Vd, the source bias Vs and the gate bias Vg at the time of the switching operation can be made 0 V except that the gate bias Vg is −2.8 V at the OFF time. Under each bias condition, the HEMTs Q1 and Q2 can be shown with the equivalent circuit diagram shown in FIG. 40, where a capacity Cgd, a capacity Cgs and the ON resistance Ron are respectively formed between the gate and drain, the gate and source, and the source and drain. Also, when they are OFF, the HEMTs Q1 and Q2 can be shown with the equivalent circuit diagram shown Lin FIG. 41, where the capacity Cgd, the capacity Cgs and a capacity Cds are respectively formed between the gate and drain, the gate and source, and the source and drain.

Figure 42:
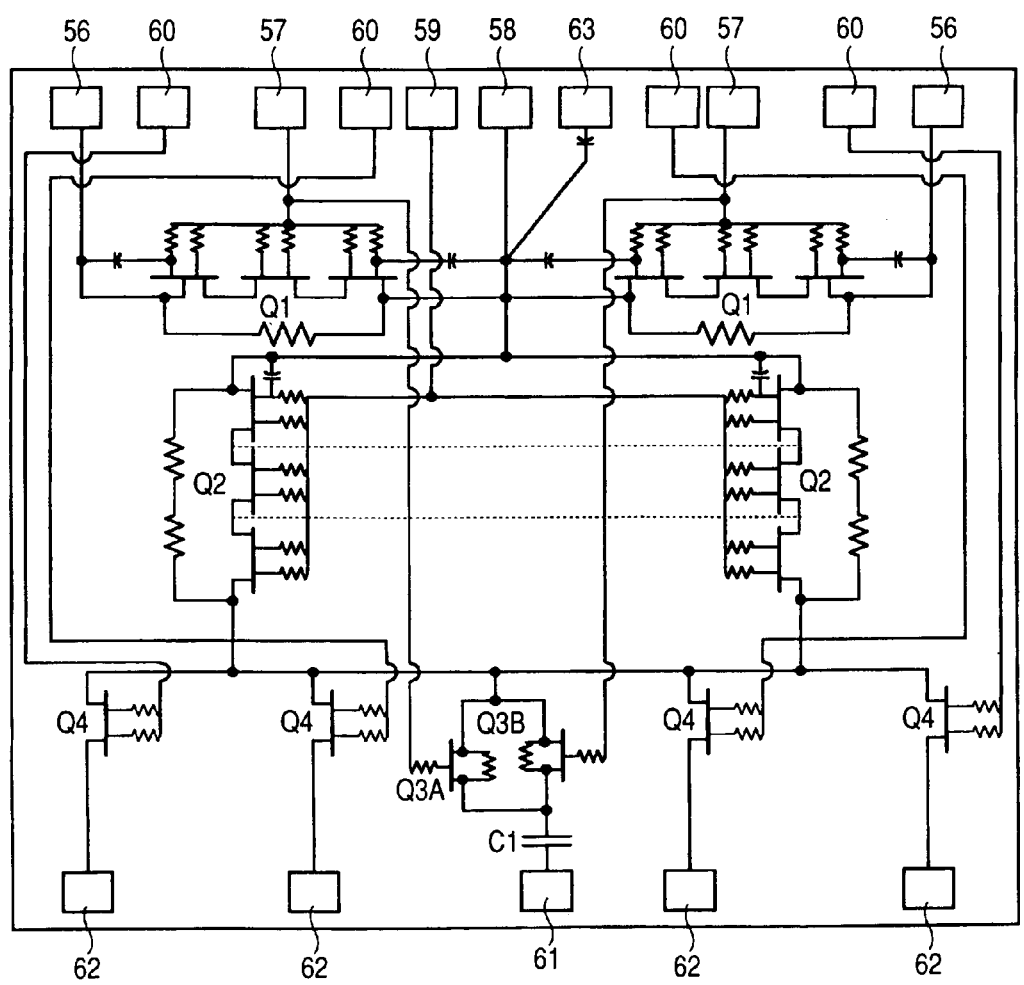
FIG. 42 is a circuit diagram of the transmission/reception switching-use switch circuit shown in FIG. 36.

FIG. 42 is a circuit diagram showing the details of the transmission/reception switching-use switch circuit 45. As shown in FIG. 42, the transmission/reception switching-use switch circuit 45 can be used in a radio frequency module capable of transmitting and receiving signals of plural bands. The transmission/reception switching-use switch 45 includes HEMTs Q3A, Q3B and Q4 in addition to the HEMTs Q1 and Q2. Terminals 56, which are electrically connected to the transmission/reception-use antenna 44 (see FIGS. 36 to 38), are electrically connected to one of the sources and drains of the two HEMTs Q1. Terminals 57 are electrically connected to gates of the HEMTs Q1, Q3A and Q3B, and the voltage Vg1 is applied via these terminals 57. Namely, the HEMTs Q3A and Q3B become ON or OFF in association with the ON or OFF of the HEMTs Q1. A terminal 58, which is electrically connected to the transmission/reception-use antenna 44, is electrically connected to one of the sources and drains of the two HEMTs Q2. A terminal 59 is electrically connected to the gates of the HEMTs Q2, and the voltage Vg2 is applied via this terminal 59. Terminal 60 are electrically connected to the gates of the HEMTs Q4. One of the sources and drains of the HEMTs Q3A and Q3B are electrically connected to the sources/drains of the HEMTs Q2 not electrically connected to the terminal 58, and the other are electrically connected to a terminal 61 via a capacity C1. Also, the terminal 61 is electrically connected to a ground potential. One of the sources and drains of the HEMTs Q4 are electrically connected to the sources/drains of the HEMTs Q2 not electrically connected to the terminal 58, and the other are electrically connected to terminals 62. A terminal 63 is electrically connected to a ground potential.

Second Embodiment

Figure 43:
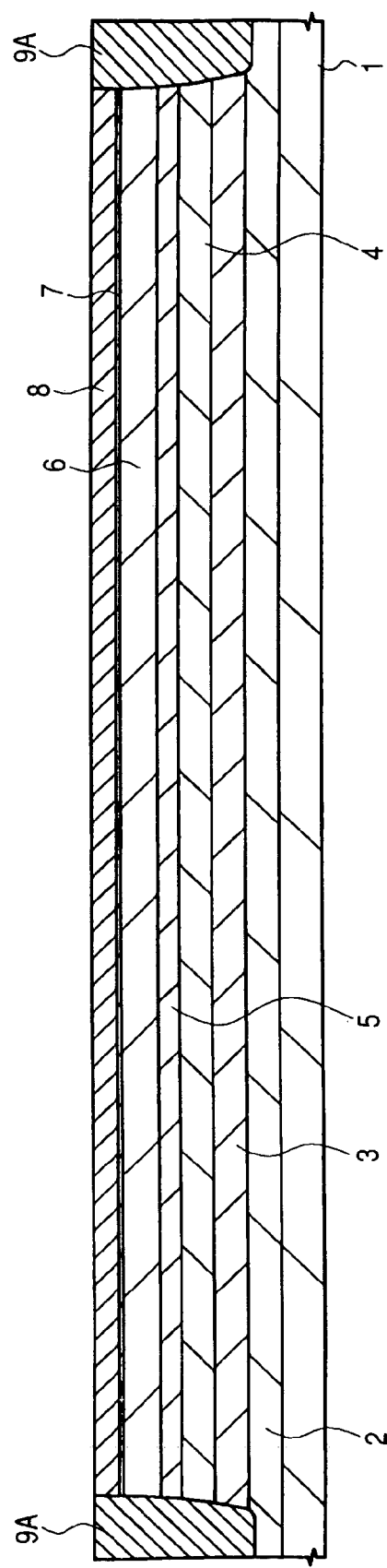
FIG. 43 is a cross-sectional diagram showing a semiconductor device of a second embodiment of the invention during a fabrication process.
Figure 44:
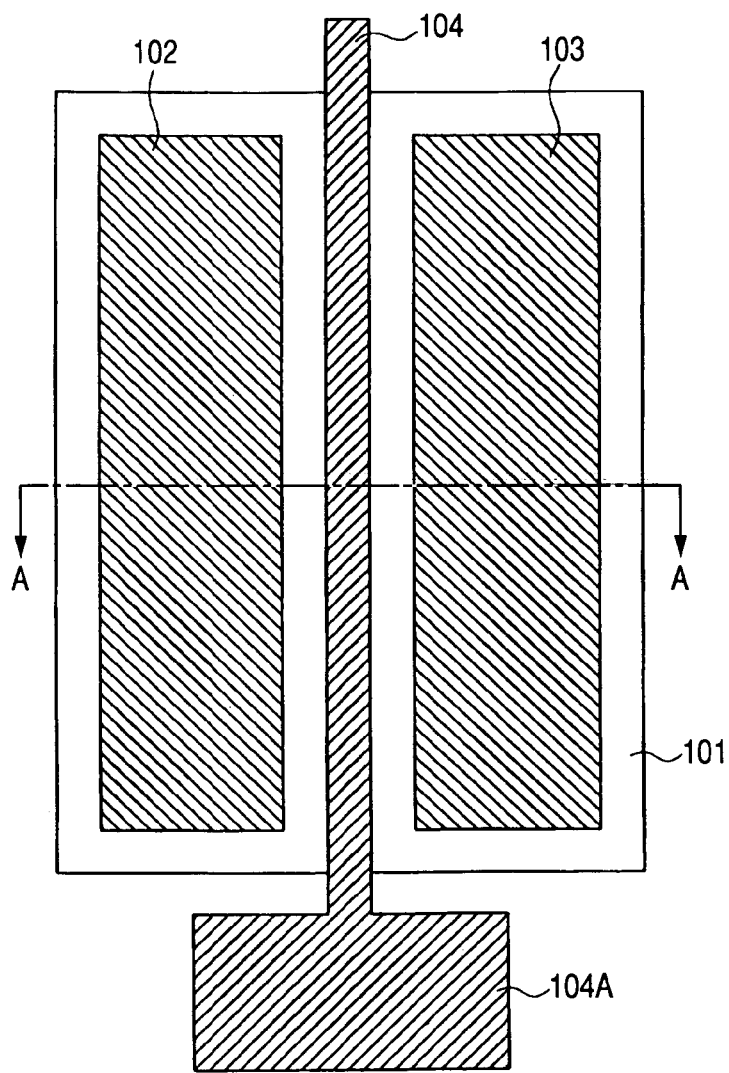
FIG. 44 is a plan diagram for describing an example of a structure of a HEMT element that the present inventors studied.
Figure 45:
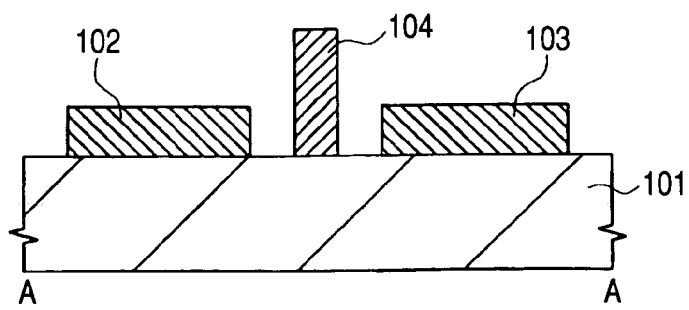
FIG. 45 is a cross-sectional diagram along line A-A of FIG. 44.
Figure 46:
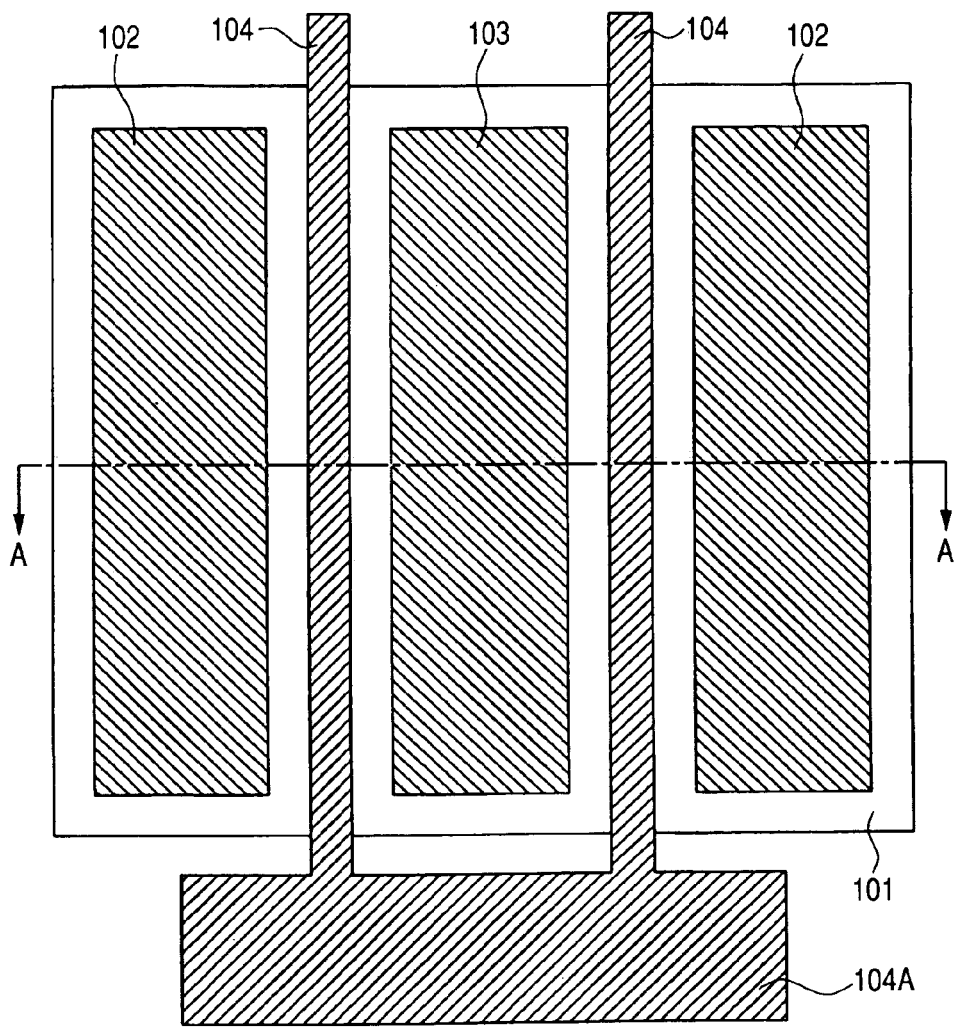
FIG. 46 is a plan diagram for describing an example of a structure of a HEMT element that the present inventors studied.
Figure 47:
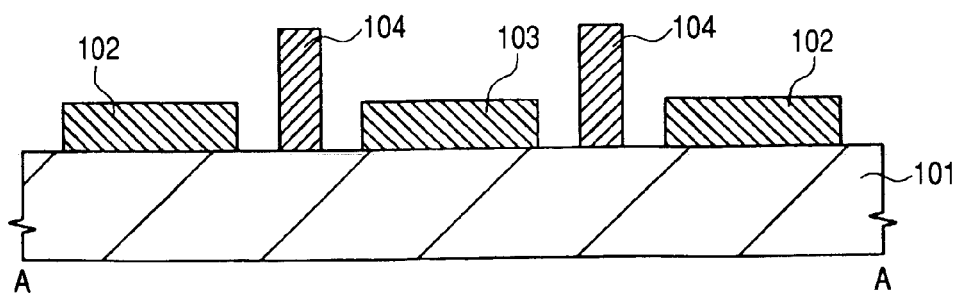
FIG. 47 is a cross-sectional diagram along line A-A of FIG. 46.
Figure 48:
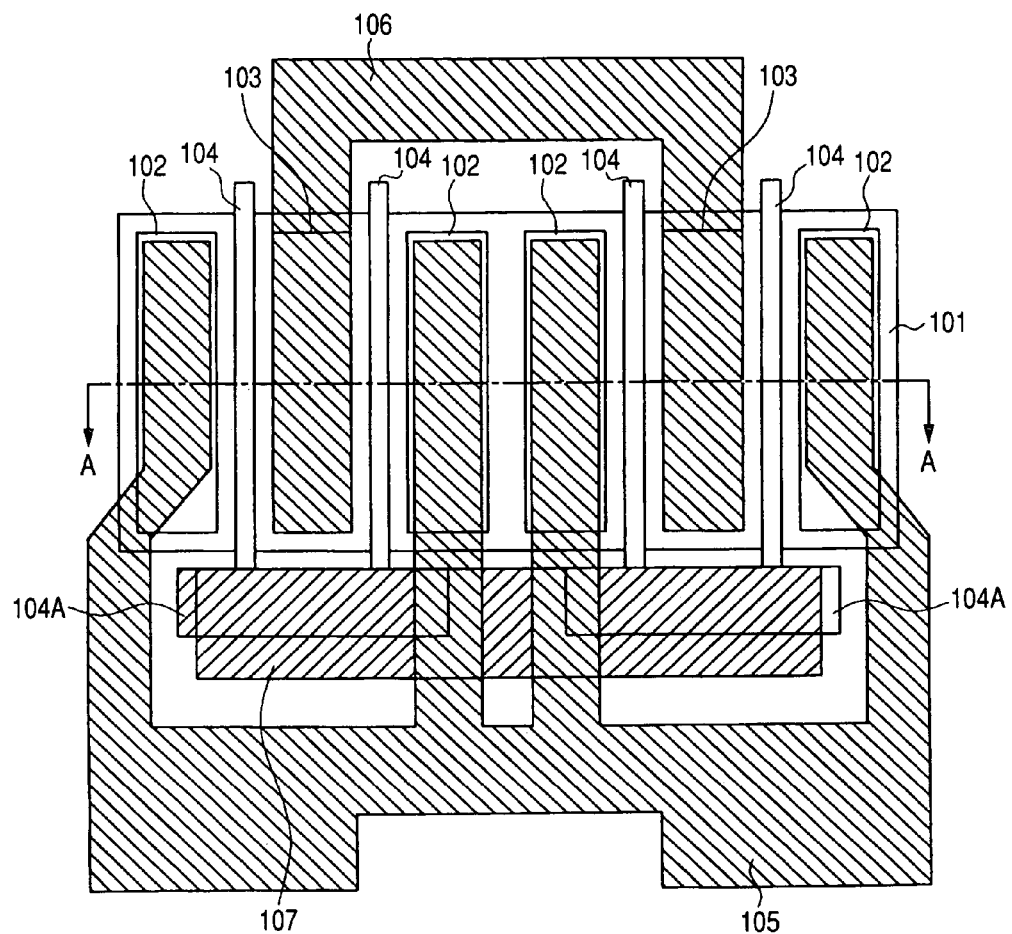
FIG. 48 is a plan diagram for describing a structure where two of the HEMT elements shown in FIG. 46 are connected in parallel.
Figure 49:
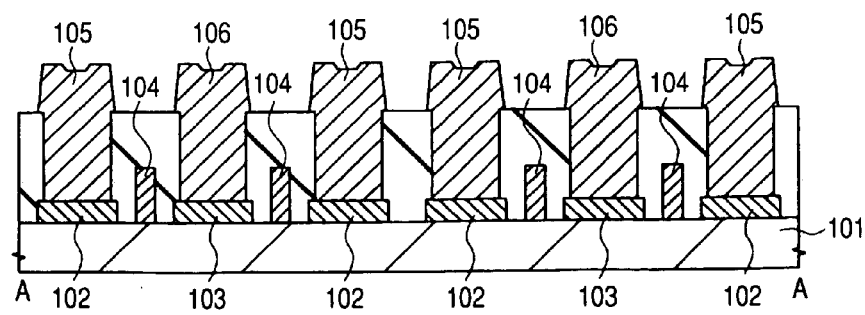
FIG. 49 is a cross-sectional diagram along line A-A of FIG. 48.
Figure 50:
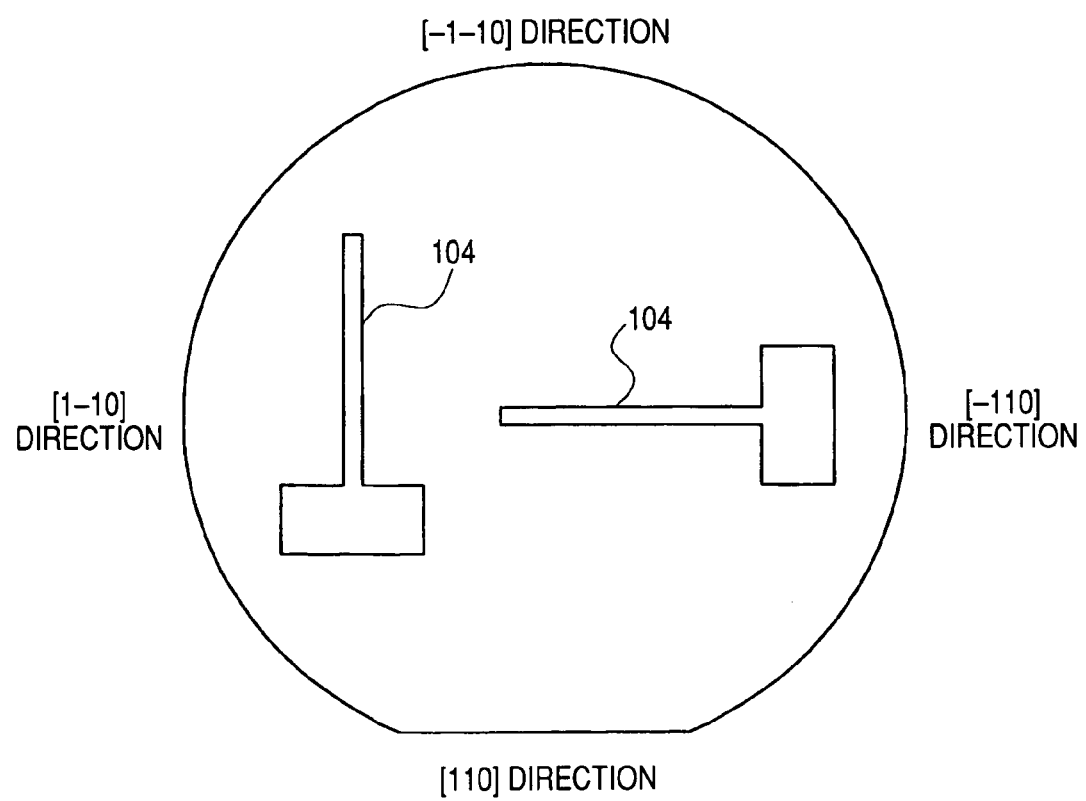
FIG. 50 is a plan diagram for describing extension directions of gate electrodes.

FIG. 43 is a cross-sectional diagram of a HEMT of a second embodiment during the fabrication process.

In the first embodiment, chip region peripheral portions of the cap layer 8, the interlayer film 7, the Schottky layer 6, the electron supplying layer 5, the channel layer 4 and the electron supplying layer 3 were removed by mesa etching to form the element separation portion 9 (see FIG. 3), but in the second embodiment, an element separation portion 9A is formed by introducing an impurity of a p-type conductive type (second conductive type) to the peripheral portion of the chip region using, as a mask, a photoresist film (not shown) that has been patterned by photolithography. In this case, H⁺ ions (hydrogen ions) or B (boron) can be used as the introduced impurity. Other than the step of forming the element separation portion 9A, the fabrication process of the second embodiment is the same as the fabrication process described in the first embodiment. By forming the element separation portion 9A by introducing an impurity in this manner, the step resulting from mesa etching is not formed. Thus, the region of the outer peripheral portion of the active region disposed in consideration of error of the formation position in terms of fabrication of this step can be reduced. Namely, because the active region defined by the isolation region 9A becomes smaller in plan view than that of the first embodiment, it becomes possible to effectively dispose the source electrodes (see FIG. 8), the drain electrodes (see FIG. 8), the gate electrodes 17 (including the gate pad 17A (see FIG. 8)), the wirings 21, 22 and 23 (see FIG. 15), and the wirings 32 and 33 (see FIG. 20). As a result, the chip can be miniaturized in comparison to that of the first embodiment.

According to the above-described second embodiment also, effects that are the same as those of the first embodiment can be obtained.

The invention made by the present inventors has been specifically described on the basis of embodiments, but the present invention is not limited to the above-described embodiments. It goes without saying that the invention may also be variously modified in a range that does not deviate from the gist of the invention.

The semiconductor device of the present invention can be applied as a switching element in an antenna switch circuit that is one radio frequency circuit included in a radio frequency module disposed in a mobile communication device such as a mobile telephone.

What is claimed is:

1. A semiconductor device including a first channel type high electron mobility transistor (HEMT), the HEMT including:
   a channel layer formed in an active region surrounded by an element separation region on a main surface of a substrate;
   an electron supplying layer formed on the channel layer;
   a gate electrode Schottky-connected to the electron supplying layer; and
   a first source electrode and a first drain electrode ohmic-connected to the electron supplying layer and a second source electrode and a second drain electrode ohmic-connected to the electron supplying layer,
   wherein the gate electrode continuously extends along a path that extends between the first source electrode and the first drain electrode along a first direction, extends toward the second source electrode along a second direction perpendicular to the first direction and extends between the second source electrode and the second drain electrode along the first direction.

2. The semiconductor device of claim 1, wherein the HEMT is a switching element in an antenna switch circuit of a communication device.

3. The semiconductor device of claim 2, wherein a gate length of the gate electrode is 1 µm or less.

4. The semiconductor device of claim 1, wherein the gate electrode is formed by a first gate portion serving as a gate of the HEMT and a second gate portion to which upper layer wiring is connected, with the first gate portion being disposed over the active region so as not to extend over the isolation region.

5. The semiconductor device of claim 2, wherein the communication device is a mobile communication device.

6. The semiconductor device of claim 1, wherein the substrate includes, as a main component, a compound semiconductor.

7. The semiconductor device of claim 6, wherein the compound semiconductor is gallium arsenic.

8. The semiconductor device of claim 1, wherein the electron supplying layer is of a first conductive type, and the isolation region is formed by introducing an impurity of a second conductive type to the substrate.

9. The semiconductor device of claim 8, wherein the impurity of the second conductive type is hydrogen ions or boron ions.

10. A semiconductor device including a first channel type high electron mobility transistor (HEMT), the HEMT including:
    a channel layer formed in an active region surrounded by an element separation region on a main surface of a substrate;
    an electron supplying layer formed on the channel layer;
    a gate electrode Schottky-connected to the electron supplying layer; and
    a first source electrode and a first drain electrode ohmic-connected to the electron supplying layer and a second source electrode and a second drain electrode ohmic-connected to the electron supplying layer,
    wherein the gate electrode continuously extends along a path that extends between the first source electrode and the first drain electrode in a first direction, extends toward the second source electrode in a second direction that intersects the first direction in plan view, and extends between the second source electrode and the second drain electrode in the first direction,
    the gate length of the gate electrode is 1 µm or less, and
    the substrate includes, as a main component, a compound semiconductor.

11. The semiconductor device of claim 10, wherein the HEMT is a switching element in an antenna switch circuit of a communication device.

12. The semiconductor device of claim 10, wherein the gate electrode is formed by a first gate portion serving as a gate of the HEMT and a second gate portion to which upper layer wiring is connected, with the first gate portion being disposed over the active region so as not to extend over the isolation region.

13. The semiconductor device of claim 11, wherein the communication device is a mobile communication device.

14. The semiconductor device of claim 10, wherein the compound semiconductor is gallium arsenic.

15. The semiconductor device of claim 10, wherein the electron supplying layer is of a first conductive type, and the isolation region is formed by introducing an impurity of a second conductive type to the substrate.

16. A semiconductor device including a first channel type high electron mobility transistor (HEMT), the HEMT including:
    a channel layer formed in an active region surrounded by an element separation region on a main surface of a substrate and having a X-axis perpendicular to a Y-axis in a plan view;
    an electron supplying layer formed on the channel layer;
    a gate electrode Schottky-connected to the electron supplying layer; and
    the element separation region having formed thereon a first drain electrode, a first source electrode positioned adjacent the first drain electrode, a second source electrode formed positioned adjacent the first source electrode such that the first source electrode is positioned between the first drain electrode and the second source electrode along the X-axis, and a second drain electrode positioned adjacent the second source electrode; the first drain electrode, first source electrode, second source electrode and second drain electrode being ohmic-connected to the electron supplying layer,
    wherein the gate electrode continuously extends from a first portion that extends between the first drain electrode and first source electrode along the Y-axis to a second portion that extends toward the second source electrode along the X-axis and to a third portion that extends between the second source electrode and the second drain electrode along the Y-axis.

17. The semiconductor device of claim 16, wherein the HEMT is a switching element in an antenna switch circuit of a communication device.

18. The semiconductor device of claim 16, wherein the gate electrode is formed by a first gate portion serving as a gate of the HEMT and a second gate portion to which upper layer wiring is connected, with the first gate portion being disposed over the active region so as not to extend over the element separation region.

19. The semiconductor device of claim 17, wherein the communication device is a mobile communication device.

20. The semiconductor device of claim 16, wherein the compound semiconductor is gallium arsenic.

21. The semiconductor device of claim 16, wherein the electron supplying layer is of a first conductive type, and the element separation region is formed by introducing an impurity of a second conductive type to the substrate.

* * * * *